United States Patent
Yamkovoy

(10) Patent No.: US 8,432,068 B2
(45) Date of Patent: Apr. 30, 2013

(54) ZERO POWER DRAIN PUSHBUTTON ON SWITCH

(75) Inventor: Paul G. Yamkovoy, Acton, MA (US)

(73) Assignee: Bose Corporation, Framingham, MA (US)

( * ) Notice: Subject to any disclaimer, the term of this patent is extended or adjusted under 35 U.S.C. 154(b) by 443 days.

(21) Appl. No.: 12/838,479

(22) Filed: Jul. 18, 2010

(65) Prior Publication Data

US 2011/0012667 A1    Jan. 20, 2011

Related U.S. Application Data

(63) Continuation-in-part of application No. 12/431,959, filed on Apr. 29, 2009, now Pat. No. 8,222,641, which is a continuation-in-part of application No. 12/431,962, filed on Apr. 29, 2009, now Pat. No. 8,213,625.

(51) Int. Cl.
 *G06F 13/40*    (2006.01)
(52) U.S. Cl.
 USPC .......................................................... 307/134
(58) Field of Classification Search .................... 307/134
See application file for complete search history.

(56) References Cited

U.S. PATENT DOCUMENTS

| 4,941,187 A | 7/1990 | Slater |
| 5,058,155 A | 10/1991 | Larsen |
| 5,806,522 A * | 9/1998 | Katims .......................... 600/554 |
| 6,388,343 B1 * | 5/2002 | Michigami et al. ........... 307/112 |
| 7,668,308 B1 | 2/2010 | Wurtz |
| 2007/0225035 A1 | 9/2007 | Gauger et al. |
| 2007/0235754 A1 * | 10/2007 | Yamamoto .................... 257/124 |
| 2008/0175402 A1 | 7/2008 | Abe et al. |

FOREIGN PATENT DOCUMENTS

WO    2008028175 A2    3/2008

OTHER PUBLICATIONS

International Search Report and Written Opinion dated Dec. 13, 2010 for Int. Appln. No. PCT/US2010/032721.
Invitation to Pay Additional Fees dated Jul. 22, 2010 for Int. Appln. No. PCT/US2010/032721.

* cited by examiner

*Primary Examiner* — Rexford Barnie
*Assistant Examiner* — Toan Vu
(74) *Attorney, Agent, or Firm* — Bose Corporation

(57) ABSTRACT

A normally-open pushbutton switch is coupled to and cooperates with a pair of MOSFETs to provide a power on switch function for a personal audio device that does not require power to be drawn from a power source to monitor the pushbutton switch while awaiting operation of the pushbutton switch to cause the personal audio device to be powered on.

3 Claims, 15 Drawing Sheets

ZERO POWER DRAIN PUSHBUTTON ON SWITCH

CROSS-REFERENCE TO RELATED APPLICATION

The present application is a continuation-in-part of application Ser. No. 12/431,959 filed Apr. 29, 2009 by Paul G. Yamkovoy and David D. Pape, and is a continuation-in-part of application Ser. No. 12/431,962 filed Apr. 29, 2009 by Paul G. Yamkovoy and David D. Pape, the disclosures of which are incorporated herein by reference.

TECHNICAL FIELD

This disclosure relates to monitoring a connection between a headset and an intercom system or radio, to possible responses to the status of the intercom or radio and the connection thereto, and to conserving a headset power source.

BACKGROUND

Two-way communications headsets are in common use in many types of vehicles and with various large pieces of machinery, especially vehicles and machinery that create a high noise environment during operation such that necessary two-way communications with the driver, operator or pilot would be impaired without such headsets. Examples of such noisy environments include airplane cockpits, driver's compartments in commercial trucks and tractors, operator cabins in cranes and tunnel boring machines, and crew compartments in tanks and other military vehicles. It is commonplace for such vehicles and machinery to incorporate an intercom system providing one or more connection points to which such headsets are coupled. Such intercoms typically cooperate with multiple ones of such headsets to enable personnel within or in the immediate vicinity of such vehicles to communicate with each other, and such intercoms typically incorporate long-range wireless transceivers enabling personnel to use such headsets in communicating with other personnel at a distance.

It has recently become increasingly desired to further enable such headsets to be coupled to portable audio devices that personnel may carry with them, in addition to being able to be coupled to an intercom system of a vehicle or large piece of machinery. Therefore, it has become desirable to enable the simultaneous coupling of a headset to both an intercom system and a personal audio device in a manner that provides a high degree of ease of use of such a combination, and avoids electrical incompatibility problems due to changes in a headset's operating state between being coupled to and uncoupled from an intercom system.

It has also become increasingly difficult to accommodate variances in the electrical characteristics encountered in headset connections provided by such intercom systems and/or long-range wireless transceivers (i.e., radios). Despite the existence of some industry and government standardization in some areas in which intercoms or radios are used, increasing complexities brought about by the addition of new features and increasing acceptance of end users making modifications have brought about a degree of ambiguity in expected characteristics and behavior. Thus, determining whether a connection to an intercom or radio has been made has been rendered more difficult, as well as determining whether that intercom or radio is active at any given time.

Further, there continues to be a desire to provide both operator convenience and conservation of power in headsets, as well as in other forms of personal audio device. Pushbutton power switches continue to be more sought-after than more traditional toggle-type power switches. However, difficulties have been encountered in providing a pushbutton power switch that does not also require the use of a combination of electronic components that continuously drain the limited power source (e.g., a battery) of a personal audio device (e.g., a headset).

SUMMARY

A normally-open pushbutton switch is coupled to and cooperates with a pair of MOSFETs to provide a power on switch function for a personal audio device that does not require power to be drawn from a power source to monitor the pushbutton switch while awaiting operation of the pushbutton switch to cause the personal audio device to be powered on. A controller of a personal audio device, on multiple occasions, monitors a conductor by which it is able to be coupled to another device for the end to an instance of signal activity, and following the end of signal activity, injects a current into the conductor and measures the resulting voltage to calculate an adaptive threshold voltage and to compare the measured voltage to the adaptive threshold to determine at least whether or not the conductor of the personal audio device is coupled to another device.

In one aspect, an apparatus includes a normally-open manually operable switch; a first MOSFET having a first gate coupled to the switch, and a first source coupled to a high voltage potential terminal of a power source to receive electric power therefrom; a second MOSFET having a second source coupled to a low voltage potential terminal of the power source; a second drain coupled to the switch and to the first gate of the first MOSFET, and a second gate to receive electric power from the power source through at least the first source and a first drain of the first MOSFET; and wherein closing the switch couples the first gate to the low potential voltage terminal of the power source, placing the first MOSFET into a conductive state, providing a high voltage potential through the first MOSFET to the second gate, placing the second MOSFET into a conductive state, providing a low voltage potential to the first gate to latch the first and the second MOSFETs in a conductive state.

In another aspect, a method includes waiting for a provision of electric power from a power source caused by a latching interaction of a first MOSFET and a second MOSFET triggered by a normally open switch; and disrupting the latching interaction of the first and second MOSFETs in response to the switch being closed.

In one aspect, an apparatus includes a conductor to enable the apparatus to be coupled to a two way communications device; a voltage sensor coupled to the conductor to measure a voltage present on the conductor relative to a ground conductor; a controller coupled to the conductor. The controller is structured to monitor the conductor for a first end to a first instance of signal activity occurring on the conductor; in response to the first end, inject a current into the conductor and operate the voltage sensor to obtain a first measure of a voltage on the conductor while the current is injected into the conductor; calculate an adaptive threshold voltage from at least the first measure; monitor the conductor for a second end to a second instance of signal activity occurring on the conductor; in response to the second end, inject a current into the conductor and operate the voltage sensor to obtain a second measure of a voltage on the conductor while the current is injected into the conductor; compare the second measure to the adaptive threshold; and in response to the second measure being greater than the adaptive threshold, turn off a component of the apparatus.

In another aspect, a method includes monitoring a conductor of a personal audio device that is structured to enable the personal audio device to be coupled to a two-way communications device for a first end to a first instance of signal activity occurring on the conductor; in response to the first end, injecting a current into the conductor and obtaining a first measure of a voltage on the conductor while the current is injected into the conductor; calculating an adaptive threshold voltage from at least the first measure; monitoring the conductor for a second end to a second instance of signal activity occurring on the conductor; in response to the second end, injecting a current into the conductor and obtaining a second measure of a voltage on the conductor while the current is injected into the conductor; comparing the second measure to the adaptive threshold; and in response to the second measure being greater than the adaptive threshold, determining that the personal audio device is not coupled to the two-way communications device in an active state, and turning off a component of the personal audio device.

Other features and advantages of the invention will be apparent from the description and claims that follow.

DETAILED DESCRIPTION

What is disclosed and what is claimed herein is intended to be applicable to a wide variety of headsets, i.e., devices structured to be worn on or about a user's head in a manner in which at least one acoustic driver is positioned in the vicinity of an ear, and in which a microphone is positioned in the vicinity of the user's mouth to enable two-way audio communications. It should be noted that although specific embodiments of headsets incorporating a pair of acoustic drivers (one for each of a user's ears) are presented with some degree of detail, such presentations of specific embodiments are intended to facilitate understanding through examples, and should not be taken as limiting either the scope of disclosure or the scope of claim coverage.

It is intended that what is disclosed and what is claimed herein is applicable to headsets that also provide active noise reduction (ANR), passive noise reduction (PNR), or a combination of both. It is intended that what is disclosed and what is claimed herein is applicable to headsets structured to be connected with at least an intercom system through a wired connection, but which may be further structured to be connected to any number of additional devices through wired and/or wireless connections. It is intended that what is disclosed and what is claimed herein is applicable to headsets having physical configurations structured to be worn in the vicinity of either one or both ears of a user, including and not limited to, over-the-head headsets with either one or two earpieces, behind-the-neck headsets, two-piece headsets incorporating at least one earpiece and a physically separate microphone worn on or about the neck, as well as hats or helmets incorporating earpieces and a microphone to enable audio communication. Still other embodiments of headsets to which what is disclosed and what is claimed herein is applicable will be apparent to those skilled in the art.

Figure 1:
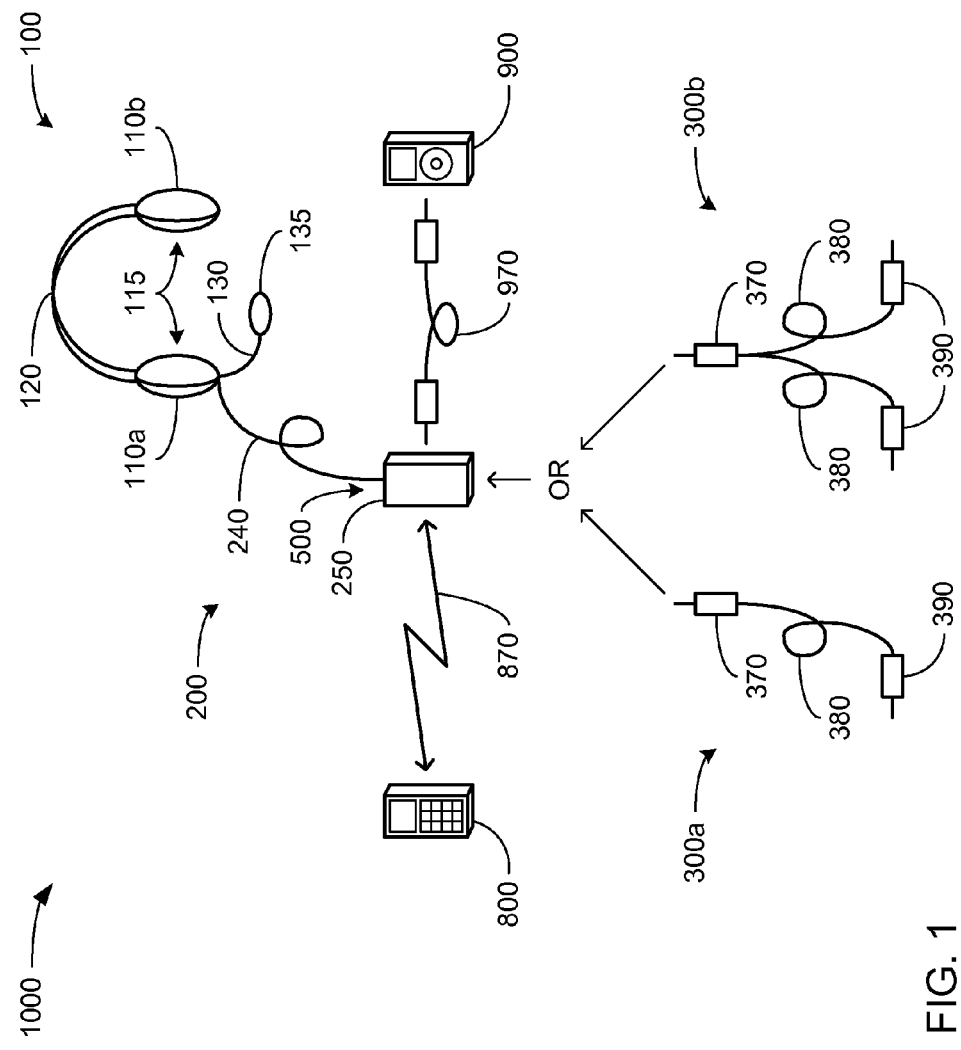
FIG. 1 is a perspective diagram of a headset.

FIG. 1 depicts an embodiment of a headset 1000 having an "over-the-head" physical configuration. The headset 1000 incorporates a head assembly 100, an upper cable assembly 200, and one or the other of a lower cable assembly 300a and a lower cable assembly 300b. The head assembly 100 incorporates a pair of earpieces 110a and 110b that each incorporate an acoustic driver 115, a headband 120 that couples together the earpieces 110a and 110b, and a microphone boom 130 extending from the earpiece 110a to support a communications microphone 135. The upper cable assembly 200 incorporates a control box 250 having a control circuit 500, and an electrically conductive cable 240 that couples the control box 250 to the earpiece 110a. The lower cable assembly 300a incorporates an upper coupling 370 that detachably couples the cable assembly 300a to the control box 250, a lower coupling 390 that detachably couples the cable assembly 300a to an intercom system (not shown), and an electrically conductive cable 380 that couples together the upper coupling 370 and the lower coupling 390. Similarly, the lower cable assembly 300b incorporates an upper coupling 370 that detachably couples the cable assembly 300b to the control box 250, a pair of lower couplings 390 that detachably couples the cable assembly 300b to an intercom system (not shown), and an electrically conductive split form of cable 380 that couples together the upper coupling 370 and the pair of lower couplings 390.

The head assembly 100 is given its over-the-head physical configuration by the headband 120. Depending on the size of each of the earpieces 110a and 110b relative to the typical size of the pinna of a human ear, each of the earpieces 110a and 110b may be either an "on-ear" (also commonly called "supra-aural") or an "around-ear" (also commonly called "circum-aural") form of earcup. As will be explained in greater detail, the provision of an acoustic driver 115 in each of the earpieces 110a and 110b enables the headset 1000 to acoustically output two-channel audio (e.g., stereo audio) to a user. The microphone boom 130 positions the communications microphone 135 is the vicinity of the mouth of a user of the headset 1000 when the head assembly 100 is correctly worn such that the earpieces 110a and 110b overly corresponding ones of the user's ears. However, despite the depiction in FIG. 1 of this particular physical configuration of the head assembly 100, those skilled in the art will readily recognize that the head assembly may take any of a variety of other physical configurations. By way of example, alternate embodiments may incorporate only one of the earpieces 110a and 110b to acoustically output only one-channel audio, may incorporate a "behind-the-head" or "behind-the-neck" variant of band in place of the headband 120, may position the communications microphone 135 on a portion of one or the other of the earpieces 110a and 110b (rather than at the end of the microphone boom 130), and/or may be structured to permit one or both of the cable 240 and the microphone boom 130 to be detachable from the earpiece 110a in order to be attached to the earpiece 110b.

The upper cable assembly 200 provides a cable-based coupling of the control box 250 the earpiece 110a (or possibly the earpiece 110b, as just discussed) through the cable 240. As will be explained in greater detail, the control circuit 500 within the control box 250 enables a user of the headset 1000 to interact with more than just an intercom system through the headset 1000. The control circuit 500 may incorporate a wireless transceiver that enables wireless communications via wireless signals 870 (e.g., infrared signals, radio frequency signals, etc.) between the control circuit 500 and a wireless device 800 (e.g., a cell-phone, an audio recording and/or playback device, a two-way radio, etc.) to thereby enable a user to interact with the wireless device 800 through the headset 1000. The control box 250 may incorporate an auxiliary input enabling the control circuit 500 to be coupled through a cable 970 to a wired device 900 (e.g., an audio playback device, an entertainment radio, etc.) to enable a user to listen through the headset 1000 to audio provided by the wired device 900. Although not specifically depicted in FIG. 1, in various possible embodiments, the control box 250 may provide one or more manually-operable controls to enable the user to control one or more aspects of the operation of the headset 1000, possibly including coordinating the transfer of audio among the headset 1000, an intercom system to which the headset may be coupled via one or the other of the lower cable assemblies 300a and 300b, the wireless device 800 and the wired device 900. Further, and although also not depicted in FIG. 1, the control circuit 500 may be incorporated into one or both of the earpieces 110a and 110b (or some other portion of the head assembly 100) in addition to or as an alternative to being incorporated within the control box 250, thereby possibly obviating the need for the upper cable assembly 200 to incorporate the control box 250.

Each of the lower cable assemblies 300a and 300b enable the coupling of the headset 1000 to an intercom system of a vehicle or large piece of machinery, including and not limited to, a truck, multi-car train, military vehicle, airplane, seafaring vessel, crane, tunnel boring machine, harvester, combine or tractor. As previously discussed, the lower cable assembly 300a incorporates a single lower connector 390 for coupling to an intercom system, while the lower cable assembly 300b incorporates a pair of lower connectors 390. As will be readily recognized by those having familiarity with such vehicles or large pieces of machinery, despite standards that may exist in some industries, it is not uncommon for manufacturers of different ones of such vehicles or large pieces of machinery to provide intercom systems having characteristics that vary among those manufacturers. Among those varying characteristics is the separation of outgoing and incoming audio signals to be conveyed through two separate connectors by some manufacturers, while other manufacturers choose to combine both outgoing and incoming audio signals to be conveyed through a single connector. Thus, the lower cable assembly 300a is structured to enable the headset 1000 to be coupled to intercom systems employing a single connector through the single lower coupling 390, while the lower cable assembly 300b is structure to enable the headset 1000 to be coupled to intercom systems employing separate connectors through the separate ones of the pair of lower couplings 390. Although a split form of the cable 380 of the cable assembly 300b is depicted as splitting at or in the vicinity of the upper coupling 370, it will be apparent to those skilled in the art that other physical configurations of the cable 380 that accommodate the separation of incoming and outgoing signals among the pair of lower couplings 390 are possible.

Figure 2:
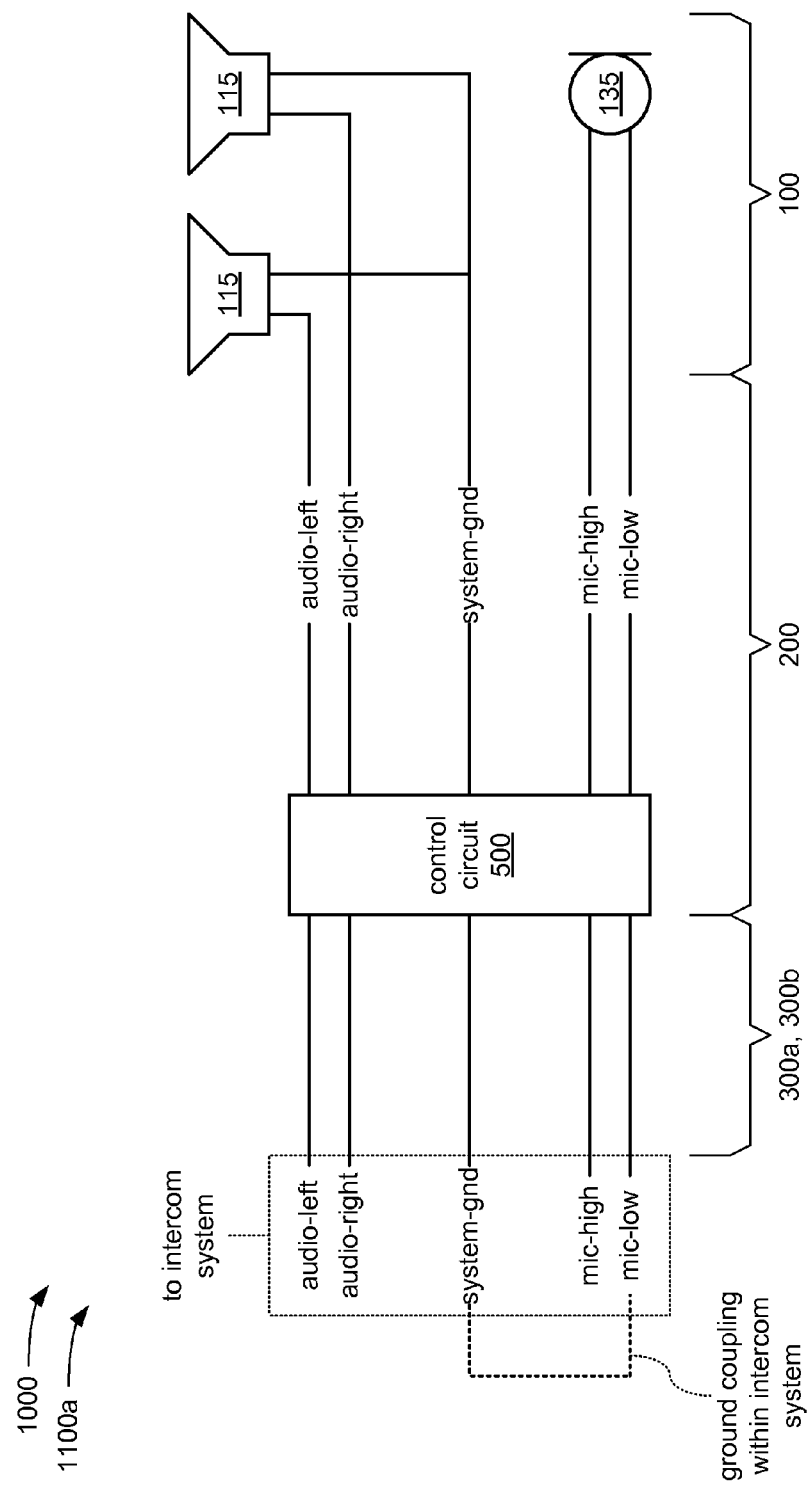
FIG. 2 is a block diagram of an electrical architecture employable in the headset of FIG. 1.

FIG. 2 depicts a possible embodiment of an electrical architecture 1100a that may be employed by the headset 1000. With one or the other of the lower cable assemblies 300a and 300b coupling the control box 250 of upper cable assembly 200 to an intercom system, and with the control box 250 being coupled to the head assembly 100 via the rest of the upper cable assembly 200, left and right audio signals (along with system ground) are able to be conveyed from the intercom system to the acoustic drivers 115, and high and low microphone signals are able to be conveyed from the communications microphone 135 to the intercom system. As will be explained in greater detail, the control circuit 500 incorporated within the control box 250 monitors the coupling of the headset 1000 to an intercom system, and controls the conveying of these signals, controls the local provision of sidetone and local microphone biasing voltage. As will also be explained in greater detail, the control circuit controls the local coupling of the system ground of the acoustic drivers 115 to the microphone low signal of the communications microphone 135, at least partly in response to whether or not the headset 1000 is coupled to an intercom system such that such a coupling is already made within the intercom system. In this way, the headset 1000 is able to be employed in interactions by a user with numerous possible combinations of an intercom system, a wireless device 800 and a wired device 900.

Figure 3:
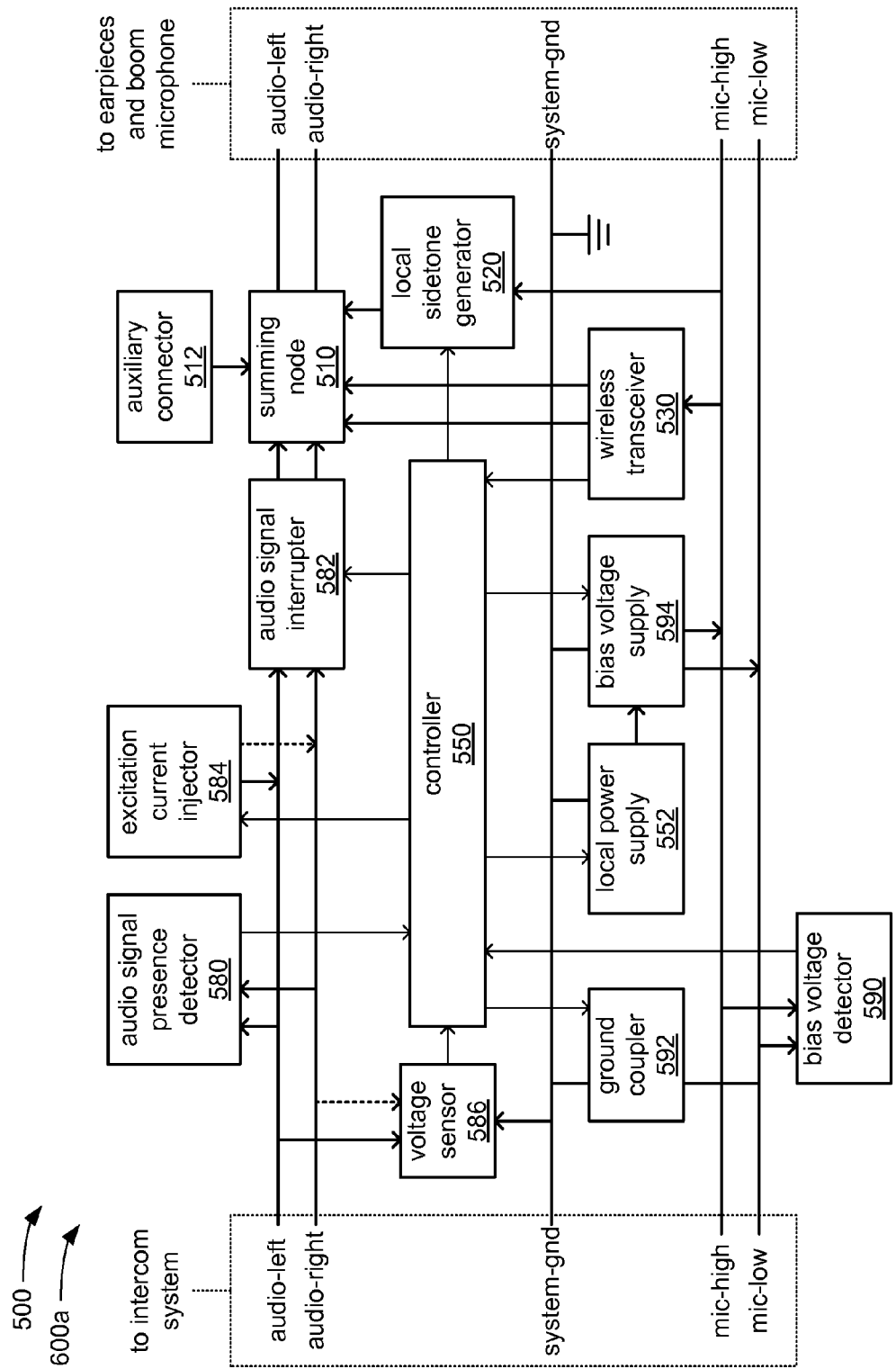
FIG. 3 is a block diagram of a control circuit of the electrical architecture of FIG. 2.

FIG. 3 depicts a possible embodiment of an electrical architecture 600a that may be employed by the control circuit 500. In employing this electrical architecture, the control circuit 500 incorporates a summing node 510, an auxiliary connector 512, a sidetone generator 520, wireless transceiver 530, a controller 550, a local power supply 552, an audio signal presence detector 580, an audio signal interrupter 582, an excitation current injector 584, a voltage sensor 586, a bias voltage detector 590 and a ground coupler 592. The controller 550 is coupled to many others of these components to monitor and/or control their functions as will be explained in greater detail. Also, and although the connections are not specifically depicted for sake of clarity of presentation, the local power supply 552 provides power to others of these components. Further, the power provided by the power supply 552 is preferably referenced to the system-gnd conductor, which is also the reference ground provided by an intercom system (when the headset 1000 is coupled to an intercom system such that the system-gnd conductor is coupled to that intercom system).

The summing node 510 combines the left and right audio signals provided by an intercom system (if the headset 1000 is coupled to an intercom system) with audio provided by a wired device (if the headset 1000 is coupled to a wired device), audio provided by the local sidetone generator 520 (if active), and audio provided by the wireless transceiver 530 (if active). Where a source of audio provides only single-channel audio (otherwise known as "mono"), the summing node 510 may combine that audio with only one of the audio-left and audio-right signals, or both. Though not specifically depicted, in some embodiments, the control box and/or at least one of the earpieces 110a and 110b may carry one or more manually-operable controls to enable a user of the headset 1000 to select or in some other way control what sources of audio are conveyed through the summing node 510 and ultimately to the acoustic drivers 115. In a preferred embodiment of the headset 1000 for use in at least aircraft, there would be no manually-operable control by which audio provided by an intercom system would be prevented from being conveyed to the acoustic drivers 115. The summing node 510 may be implemented as a resistor network, a summing amplifier, or other mechanism for combining audio as will be familiar to those skilled in the art.

The auxiliary connector 512 enables a wired device (such as the wired device 900 depicted in FIG. 1) to be coupled by a cable (such as the cable 970) to control circuit 500 to thereby allow audio provided by the wired device to be summed with other audio by the summing node 510, and ultimately provided to the acoustic drivers 115. In various possible embodiments, the auxiliary connector 512, in cooperation with the summing node 510, may enable the provision of either single-channel or two-channel audio for being combined with other audio by the summing node 510. As depicted, the auxiliary connector 512 makes no provision for a two-way exchange of audio. However, as those skilled in the art will readily recognize, other variations of the auxiliary connector 512 are possible through which signals from the communications microphone 135 are made available to a wired device coupled to the auxiliary connector 512.

The local sidetone generator 520 can be employed to convey sounds detected by the communications microphone 135 to the acoustic driver 115 (through the summing node 510) as a way of providing a user of the headset 1000 a more natural acoustic experience when talking. Studies have revealed that people are accustomed to hearing the sound of their own voice when talking, that the human mind uses this self-hearing of speech as part of regulating speech volume (i.e., how loud to talk), and that an inability to maintain an appropriate speech volume begins to occur when a person is substantially prevented from hearing themselves talk. Especially in embodiments of the headset 1000 in which the earpieces provide some degree of either passive or active noise reduction, and especially when the headset 1000 is used in a noisy environment, the ability of a person to hear their voice well enough to enable normal self-regulation of speech volume can become greatly impaired. The sidetone generator 520 passes through a variation of the sounds detected by the communications microphone 135 that may be attenuated and/or filtered in some way to approximate the normal experience of a person hearing themselves talk in order to enable normal self-regulation of speech volume. In some embodiments, sounds detected by the communications microphone may be subjected to a bandpass filter within the local sidetone generator 520 to limit sounds conveyed to the summing node 510 to those within a range of frequencies typically associated with human speech.

The wireless transceiver 530 enables a wireless device (such as the wireless device 800 depicted in FIG. 1) to be wirelessly coupled to the control circuit 500 to thereby allow audio received from the wireless device to be summed with other audio by the summing node 510, and to thereby allow sounds detected by the communications microphone 135 to transmitted to the wireless device. In this way, two-way audio communications is enabled between the headset 1000 and such a wireless device. In various embodiments, the wireless coupling may be through radio frequency (RF) signals, possibly RF signals meant to comply with one or more widely known and used industry standards for RF communication including, and not limited to, the Bluetooth specification promulgated by the Bluetooth SIG based in Bellevue, Wash., or the ZigBee specification promulgated by the ZigBee Alliance based in San Ramon, Calif.

The audio signal presence detector 580 monitors the audio-left and audio-right conductors of the lower cable assembly 300a or 300b for activity associated with signals conveying sounds from an intercom system (if the headset 1000 is coupled to an intercom system) and ultimately to the acoustic drivers 115. The audio signal interrupter 582 is able to be operated to selectively disconnect the audio-left and audio-right conductors of the lower cable assembly 300a or 300b from the audio-left and audio-right conductors coupled through the upper cable assembly 200 to head assembly 100. The excitation current injector 584 is able to be operated to selectively function as a current source injecting a current onto one or both of the audio-left and audio-right conductors of the lower cable assembly 300a or 300b. The voltage sensor 586 is able to measure a voltage that might be present on one or both of the audio-left and audio-right conductors of the lower cable assembly 300a or 300b (as a result of the injection of current by the excitation current injector 584) as referenced to the system-gnd conductor.

The bias voltage detector 590 is able to detect the presence or absence of a microphone bias voltage across the mic-high and mic-low conductors. As previously explained, in typical intercom systems, the mic-low and system-gnd conductors are coupled together. However, as also previously explained, the possible use of the lower cable assembly 300b makes possible a situation where only one or the other of the system-gnd and mic-low conductors is coupled to an intercom system, thereby preventing the coupling of the mic-low conductor to the system-gnd conductor such that the mic-low conductor may be floating relative to the system ground conductor. Therefore, in order to detect a bias voltage across the mic-low and mic-high conductors at a time when the mic-low conductor is floating relative to the system-gnd conductor, an the bias voltage detector 590 may be implemented with an opto-isolator. The ground coupler 592 is able to be operated to selectively couple the system-gnd conductor to the mic-low conductor. In an effort to minimize power consumption by the ground coupler 592, it may be implemented using a MOSFET. The bias voltage supply 594 is able to be operated to selectively provide a microphone bias voltage on the mic-high and mic-low conductors.

The controller 550 is coupled to and receives signals indicating status from one or more of the wireless transceiver 530, the audio signal presence detector 580, the voltage sensor 586, and the bias voltage detector 590. The controller is coupled to and sends signals to operate one or more of the local sidetone generator 520, the audio signal interrupter 582, the excitation current generator 584 and the ground coupler 592. The controller 550 may be implemented in any of a number of ways. In some embodiments, the controller 550 is a combination of a processing device and a storage device in which is stored a sequence of instructions that is executed by the processing device of the controller 550 to cause that processing device to perform a number of tasks as are described herein. Possible implementations of such a processing device include, and are not limited to, a general purpose central processing unit (CPU), a digital signal processor (DSP), a microcontroller, a sequencer, and a state machine implemented with discrete logic. Possible implementations of such a storage include, and are not limited to, dynamic random access memory (DRAM), static random access memory (SRAM), read-only memory (ROM), electrically erasable programmable read-only memory (EEPROM), any of a variety of other types of volatile and/or non-volatile solid state memory storage technologies, magnetic and/or optical storage media, and any of a variety of other types of storage media.

The controller 550 cooperates with the audio signal presence detector 580, the audio signal interrupter 582, the excitation current injector 584 and the voltage sensor 586 to perform a test to determine whether or not at least the audio-left, the audio-right and the system-gnd conductors of the lower cable assembly 300a or 300b are connected to an intercom system on a recurring basis. The audio signal presence detector 580 signals the controller 550 upon detecting an instance of their being a lack of activity on one or both of the audio-left and audio-right conductors of the lower cable assembly 300a or 300b consistent with no audio being provided by an intercom system. In response, the controller 550 may operate the audio signal interrupter 582 to disconnect the audio-left and audio-right conductors of the lower cable assembly 300a or 300b from the same two conductors that are coupled to the head assembly 100. Then, while the audio signal interrupter is still operated to disconnect conductors, the controller 550 may operate the excitation current injector 584 to function as a current source and output a current onto one or both of the audio-left and audio-right conductors coupled to the lower cable assembly 300a or 300b, while the voltage sensor 586 signals the controller 550 with an indication of what voltages are observed on one or both of these conductors. As will be familiar to those skilled in the art, if the audio-left, audio-right and system-gnd conductors of the lower cable assembly 300a or 300b are not coupled to an intercom system, there will be a very high resistance (theoretically, a near-infinite resistance) between the system-gnd conductor and each of the audio-left and audio-right conductors such that a relatively high voltage will be found to be present by the voltage sensor 586 on one or both of the audio-left and audio-right conductors relative to the system-gnd conductor. However, if these conductors are coupled to an intercom system, then there will be a far lower resistance between the system-gnd conductor and each of the audio-left and audio-right conductors such that a relatively low voltage will be found to be present by the voltage sensor 586.

If the voltage sensor 586 indicates to the controller 550 that voltages consistent with these conductors being coupled to an intercom system are present, then the controller 550 operates the audio signal interrupter 582 to reconnect conductors and operates the excitation current injector 584 to cease sourcing a current onto either of the audio-left and audio-right conductors of the lower cable assembly 300a or 300b. However, if the voltage sensor 586 indicates to the controller that voltages consistent with no such connection to an intercom system are present, then the controller 550 may continue to operate the audio signal interrupter 582 to continue disconnecting conductors, and may continue to operate the excitation current injector 584 to source a current onto one or both of the audio-left and audio-right conductors, either continuously or on a repeating interval. Such use of the audio signal interrupter 582 to disconnect conductors serves to ensure that the voltages seen are not influenced by resistances and/or currents from other components of the headset 1000, and serves to ensure that the user is not caused to hear various audio artifacts (e.g., popping, static, crackling or buzzing noises).

The controller 500 additionally cooperates with the transceiver 530, the bias voltage detector 590, the ground coupler 592 and the bias voltage supply 594 to determine whether or not the mic-high and mic-low conductors are connected to an intercom system, and to determine whether to couple the system-gnd and mic-low conductors, provide a bias voltage across the mic-low and mic-high conductors, and/or provide sidetone. These actions that the controller 500 may take are in recognition of the fact that in the electrical architecture for the control circuit 500 depicted in FIG. 3, the communications microphone provides signals representing sounds that it has detected only to one or both of an intercom system (if the headset 1000 is coupled to an intercom system) and the transceiver 530. These actions are also taken in recognition of the fact that the mic-low and system-gnd conductors are typically coupled within an intercom system to which the headset 1000 may be coupled, and that it is usually desirable to avoid also coupling those same conductors within a headset used with such an intercom system due to the possible introduction of electromagnetic interference and audible noise that may arise from the ground loop that may be created by such a redundant connection within a headset. It should be noted that these possible actions may differ somewhat from what is about to be described for the depicted electrical architecture in a case where the control circuit 500 employs an alternate electrical architecture that additionally accommodates two-way communication through the auxiliary connector 512.

At times when the wireless transceiver 530 has been turned off or otherwise put into an inactive operating state by the user in which the transceiver 530 is neither prepared for use nor in use, the controller 550 ignores all indications from the bias voltage detector 590 of whether or not there is a bias voltage present across the mic-high and mic-low conductors, and ignores all results of tests performed to determine whether or not at least the audio-left, audio-right and system-gnd conductors are coupled to an intercom system. At these times, the controller 550 operates the ground coupler 592 to not couple the system-gnd and mic-low conductors, operates the bias voltage supply 594 to not provide a bias voltage across the mic-low and mic-high conductors, and operates the local sidetone generator 520 to not provide sidetone. In this way, electric power is not wasted by the bias voltage supply 594 providing a bias voltage or the local sidetone generator 520 providing a sidetone when neither is needed as a result of the communications microphone 135 not being used with the wireless transceiver 530. At these times, it is still possible for the communications microphone 135 to be used with an intercom system, since it is typical for intercom systems of vehicles and large machinery to provide sidetone and any needed bias voltage.

At times when the wireless transceiver 530 enters into or remains in the standby operating state such that it is prepared for being used, the controller 550 makes use of indications provided by the bias voltage detector 590 and results of the tests of whether the audio-left, audio-right and system-gnd conductors are coupled to an intercom system. The controller 550 uses such indications and test results in determining whether or not to operate the ground coupler 592 to couple the system-gnd and mic-low conductors in preparation for the communications microphone 135 being used with the wireless transceiver 530. However, as long as the transceiver 530 indicates to the controller 550 that the transceiver 530 is on standby, the controller 550 operates the bias voltage supply 594 to refrain from providing a bias voltage, and operates the local sidetone generator 520 to refrain from providing sidetone. While the transceiver 530 is on standby, if the bias voltage detector 590 does not detect a bias voltage, then it's presumed that the mic-low and mic-high conductors are not coupled to an intercom system, and the controller 550 operates the ground coupler 592 to couple the mic-low conductor to the system-gnd to prepare the communications microphone 135 for use with the transceiver 530.

Alternatively, while the transceiver 530 is on standby, if the bias voltage detector 590 does detect a bias voltage, then it's presumed that the mic-low and mic-high conductors are coupled to an intercom system. If results of tests to determine whether or not the audio-left, audio-right and system-gnd conductors are also coupled to the intercom system indicate that those conductors are so coupled, then the controller 550 operates the ground coupler 592 to not couple the mic-low and system-gnd conductors to avoid creating a ground loop. However, if results of tests to determine whether or not the audio-left, audio-right and system-gnd conductors are also coupled to the intercom system indicate that those conductors are not so coupled, then the controller 550 operates the ground coupler 592 to couple the mic-low and system-gnd conductors, since they are not able to be coupled through the intercom system.

At times when the wireless transceiver 530 transitions into the operating state of being in use or remains in use, the controller 550 makes use of indications provided by the bias voltage detector 590 and results of the tests of whether the audio-left, audio-right and system-gnd conductors are coupled to an intercom. The controller 550 uses such indications and test results in determining whether or not to operate the ground coupler 592 to couple the system-gnd and mic-low conductors to enable the communications microphone 135 to be used with the wireless transceiver 530. Starting at the time the wireless transceiver 530 transitions into being in use and while it remains in use, if the bias voltage detector 590 detects a bias voltage, it's presumed that the mic-low and mic-high conductors are coupled to an intercom system, and the controller 550 operates the bias voltage supply 594 to refrain from providing a bias. If results of tests to determine whether or not the audio-left, audio-right and system-gnd conductors are also coupled to the intercom system indicate that those conductors are so coupled, then the controller 550 operates the ground coupler 592 to not couple the mic-low and system-gnd conductors, and operates the local sidetone generator 520 to not provide sidetone. However, if results of tests to determine whether or not the audio-left, audio-right and system-gnd conductors are also coupled to the intercom system indicate that those conductors are not so coupled, then the controller 550 operates the ground coupler 592 to couple the mic-low and system-gnd conductors, and operates the local sidetone generator 520 to provide sidetone.

Alternatively, starting at the time the wireless transceiver 530 transitions into being in use and while it remains in use, if the bias voltage detector 590 ever detects an absence of a bias voltage, it's presumed that the mic-low and mic-high conductors either were not coupled to an intercom system at the start of the wireless transceiver 530 being in use or were subsequently uncoupled from an intercom system while the wireless transceiver 530 was in use. In response, the controller operates the ground coupler 592 to couple the mic-low and system-gnd conductors, operates the bias voltage supply 594 to provide a bias voltage, and operates the local sidetone generator 520 to provide sidetone. Further, since the provision of a bias voltage by the bias voltage supply 594 results in the bias voltage detector 590 not being able to detect if a bias voltage is subsequently again provided by an intercom system, the controller 550 simply continues to operate the ground coupler 592 to couple the mic-low and system-gnd conductors, continues to operate the bias voltage supply 594 to provide a bias voltage, and continues to operate the local sidetone generator to provide sidetone for as long as the wireless transceiver 530 continues to indicate that it is in use.

Only when the wireless transceiver 530 ceases to indicate to the controller 550 that the wireless transceiver is in use (e.g., by entering into either an inactive operating state, or a standby operating state) does the controller 550 then operate the bias voltage supply 594 to cease providing a bias voltage and operate the local sidetone generator to cease providing sidetone. The operating of the of the bias voltage supply to cease providing a bias voltage enables the bias voltage detector 590 to once again monitor the mic-low and mic-high conductors for an indication of a bias voltage being provided by an intercom system. If the wireless transceiver 530 is transitioning to an inactive operating state (such as being turned off), then the controller also operates the ground coupler 592 to cease coupling the system-gnd and mic-low conductors, and the controller 550 once again ignores any indication by the bias voltage detector 590 of whether or not an intercom system is providing a bias voltage. Alternatively, if the wireless transceiver 530 is transitioning to a standby operating state, then whether or not the ground coupler 592 is operated to cease coupling the mic-low and system-gnd conductors will once again depend on the results of tests of whether the audio-left, audio-right and system-gnd signals are coupled to an intercom and on whether the bias voltage detector 590 detects a bias voltage being supplied by an intercom system.

Since, as just explained, it is possible for the bias voltage supply 594 to continue providing a bias voltage even after the mic-low and mic-high conductors are once again coupled to an intercom system that also provides a bias voltage, the bias voltage supply 594 is structured to avoid ever damaging an intercom system by providing a bias voltage that could be higher than a bias voltage provided by any intercom system to which the headset 1000 might be coupled. Further, the bias voltage supply 594 is also structured to incorporate one or more diodes, a rectifier and/or other protective circuitry to avoid being damaged by the provision of a higher bias voltage by an intercom system at the same time that the bias voltage supply 594 is also providing a bias voltage. It is presumed that the wireless transceiver 530 will not remain in the operating state of being in use indefinitely, since it is presumed that a user of the headset 1000 will, at some point, cease engaging in two-way communications with a wireless device through the wireless transceiver 530.

These separate tests of whether the mic-low and mic-high conductors are coupled to an intercom system and of whether the audio-left, audio-right and system-gnd conductors are coupled to an intercom system are carried out to accommodate the use of the lower cable assembly 300b in which the provision of two of the lower couplings 390 (one for at least the mic-low and mic-high conductors, and the other for at least the audio-left, audio-right and system-gnd conductors) enable the independent coupling and uncoupling of each of these two sets of conductors. The ability to couple only the audio-left, audio-right and system-gnd conductors to an intercom system may be deemed desirable by a user who wishes to hear communications occurring through that intercom system, but does not wish others coupled to that intercom system to hear their own two-way communications involving the headset 1000 and a wireless device (such as the wireless device 800 of FIG. 1). The ability to couple only the mic-low and mic-high conductors to an intercom system may be deemed desirable by a user who wishes to be able to say something through that intercom system, but who needs to momentarily remove the distraction of hearing others through that intercom system so that they can momentarily concentrate on listening to audio provided by either a wireless device or a wired device coupled by a cable to the headset 1000 (such as the wired device 900 of FIG. 1). Thus, the employment of these separate tests to separately determine whether or not the mic-low and mic-high conductors or the audio-left, audio-right and system-gnd conductors are coupled to an intercom system to accommodate the lower cable assembly 300*b* can result in desired flexibility in the use of the headset 1000 being provided to a user.

These separate tests, their possible interactions, and the possible resulting actions that the controller 550 may take, and which have just been described at length, are summarized in the following table:

| Audio Line Connection Status | Microphone Line Connection Status | Wireless Transceiver Status | Coupling of system-gnd & mic-low | Microphone Bias | Sidetone |
|---|---|---|---|---|---|
| not connected | not connected | inactive | not coupled | none | none |
| | | standby | coupled locally | none | none |
| | | in use | coupled locally | supplied locally | supplied locally |
| | connected | inactive | not coupled | supplied by intercom | none |
| | | standby | coupled locally | | none |
| | | in use | coupled locally | | supplied locally |
| connected | not connected | inactive | not coupled | none | none |
| | | standby | coupled locally | none | none |
| | | in use | coupled locally | supplied locally | supplied locally |
| | connected | inactive standby in use | coupled by intercom | supplied by intercom | supplied by intercom |

However, where the lower cable assembly 300*a* is employed in place of the lower cable assembly 300*b*, the possible interactions of the results of these separate tests, and the possible resulting actions taken by the controller 550 become greatly simplified, and are summarized in the following table:

| Audio & Microphone Line Connection Status | Wireless Transceiver Status | Coupling of system-gnd & mic-low | Microphone Bias & Sidetone |
|---|---|---|---|
| not connected | inactive | not coupled | none |
| | standby | coupled locally | none |
| | in use | coupled locally | supplied locally |
| connected | inactive standby in use | coupled by intercom | supplied by intercom |

As can be appreciated through the comparison of the above two tables, where the lower cable assembly 300*a* is employed in place of the lower cable assembly 300*b*, it may be possible to cease performing either the tests to determine whether the audio-left, audio-right and system-gnd conductors are coupled to an intercom system or the tests to determine whether the mic-low and mic-high conductors are coupled to an intercom system. Indeed, in one possible embodiment of the headset 1000, a switch, sensor, connector contact with a pull-down or pull-up resistor, or other mechanism may be employed to provide an indication to the controller 550 of which of the lower cable assemblies 300*a* and 300*b* are being employed at any given time, and the controller 550 may use such an indication to alter the tests that are performed to determine what conductors are coupled to an intercom system and/or to alter the actions taken by the controller 550 in response to the results of one or more of those tests.

It should be noted that the above description of these tests and possible resulting actions that the controller 550 may take are partly based on the assumption that the intercom system is active such that the intercom system will provide a bias voltage when the mic-low and mic-high conductors are coupled to the intercom system, and such that the intercom system will provide sidetone when the mic-low, mic-high, audio-left, audio-right and system-gnd conductors are all coupled to the intercom system. However, there may be situations in which the intercom system of a vehicle or large piece of machinery may not be turned or may in other ways be at least partly inactive such that a bias voltage and/or sidetone are not provided.

In some embodiments, where the mic-low and mic-high conductors are coupled to an intercom system, but the intercom system fails to provide a bias voltage, the controller 550 responds in a manner substantially similar to how it has been described above as responding to the mic-low and mic-high signals not being coupled to an intercom system. In other words, the controller 550 responds to the lack of a bias voltage being provided by the intercom system at times when a user employs the communications microphone 135 in two-way communications through the wireless transceiver 530 by operating the bias voltage supply 594 to provide a bias voltage. Unfortunately, and as will be familiar to those skilled in the art, the connection of the mic-low and mic-high signals to an intercom system that does not provide a bias voltage will likely result in a greater draw of current from the bias voltage supply 594 through the intercom system. This may be significant where the local power supply 552 is of limited capacity (e.g., is a battery or similarly limited power source) such that the local power supply 552 will be drained at an increased rate.

On occasions where all of the mic-low, mic-high, audio-left, audio-right and system-gnd conductors are coupled to an intercom system that is turned off or otherwise inactive, whether the controller 550 operates the ground coupler 592 to couple the system-gnd and mic-low conductors and whether the controller 550 operates the local sidetone generator 520 to provide sidetone may depend on how the controller 550 interprets the results of the recurring test to detect the coupling of the audio-left and/or audio-right conductors to an intercom system. As previously discussed at length, the test of whether or not the audio-left and/or audio-right conductors are coupled to an intercom system entails injecting a current into one or both of the audio-left and audio-right conductors and observing the voltage that results, where a relatively high voltage indicates that there is no such coupling and a relatively low voltage indicates that there is such a coupling. As also previously discussed, the relatively high voltage results from the lack of current flowing from the audio-left and audio-right conductors to the system-gnd conductor as a result of their being no coupling of these conductors through an intercom system, while the relatively low voltage results from their being a relatively low resistance coupling between these conductors through an intercom system that allows a current flow to take place. However, as those skilled in the art will readily recognize, the resistance through the portion of an intercom system to which the audio-left, audio-right and system-gnd conductors may be coupled does change depending on whether or not that intercom system is active such that the audio-left and audio-right conductors are being driven by that intercom system. More particularly, resistance between the system-gnd conductor and each of the audio-left and audio-right conductors is higher when an intercom system is inactive such that the audio-left and audio-right conductors are not driven than when an intercom system is active such that the audio-left and audio-right conductors are driven.

Therefore, in other embodiments, during tests to determine whether the audio-left, audio-right and system-gnd conductors are coupled to an intercom, the controller 550 evaluates the voltage(s) detected by the voltage sensor 586 to determine whether the voltage(s) fall within a range of voltages indicative of these conductors being coupled to an active intercom system, being coupled to an inactive intercom system, or not being coupled to an intercom system. In response to a voltage in a range of voltages indicative of being coupled to an active intercom system or a voltage in a range of voltages indicative of not being coupled to an intercom system, the controller 550 may take action in ways consistent with what has been previously discussed at length, above. However, in response to a voltage in a range of voltages indicative of being coupled to an inactive intercom system, the controller 550 may operate the bias voltage supply 594 and the local sidetone generator 520 to provide a bias voltage and sidetone at least at times when a user employs the communications microphone 135 to engage in two-way communications through the wireless transceiver 530. Given that the bias voltage detector 590 would be incapable of distinguishing between whether the mic-low and mic-high signals are not coupled to an intercom system or are coupled to an inactive intercom system that does not provide a bias voltage, the controller may further respond to a voltage in a range of voltages indicative of the audio-left, audio-right and system-gnd signals being coupled to an inactive intercom system by also operating the bias voltage supply 594 to provide a bias voltage at least at times when a user employs the communications microphone 135 to engage in two-way communications through the wireless transceiver 530. Alternatively, in an effort to prevent the local power supply 552 being drained at an increased rate, the controller may respond to a voltage in a range indicative of the audio-left, audio-right and system-gnd signals being coupled to an inactive intercom system by either operating the local power supply 552 to turn off many of the components of the control circuit 500 such that a user cannot use the headset 1000, or enabling only the components of the control circuit 500 that are needed to enable the user to listen to audio provided through the auxiliary connector 512.

In still other embodiments, the ability to interpret the voltage(s) observed during tests to determine whether or not the audio-left, audio-right and system-gnd conductors are coupled to an active intercom system, are coupled to an inactive intercom system or are not coupled to an intercom system may be combined with an enhanced ability to determine whether or not the mic-low and mic-high conductors are coupled to an active intercom system, are coupled to an inactive intercom system or are not coupled to an intercom system. Such an enhanced ability may be provided through the addition of an ability to detect and use periods of inactivity on the mic-low and mic-high conductors to inject a current in the mic-high conductor and measure a voltage in a manner not unlike what has been described as being done with the audio-left and audio-right conductors. Further, a microphone signal interrupter (not shown) may be incorporated into the control circuit 500 to divide the mic-low and/or mic-high conductors in a manner not unlike the dividing of the audio-left and audio-right conductors by the audio signal interrupter 582. Dividing the mic-low and/or mic-high conductors may be done at least in response to determining that these conductors are coupled to an inactive intercom system in order to avoid the previously described increased drain of power from the local power supply 552.

Still further, the approach of injecting a current into the mic-high conductor may be employed to determine whether or not the mic-low and mic-high conductors are coupled to an intercom system where the communications microphone 135 is a dynamic microphone, and not an electret microphone. As those skilled in the art will readily recognize, dynamic microphones do not require the provision of a bias voltage, and therefore, the presence or absence of a bias voltage could not be relied upon to determine whether or not the mic-low and mic-high conductors are coupled to an intercom system. Further, concerns over draining the local power supply 552 through the provision of a bias voltage by the bias voltage supply 594 would be obviated since the bias voltage supply 594 would not be present in the control circuit 500. Still further, the question of whether the mic-low and mic-high conductors are coupled to an intercom system that is either active or inactive may not be of importance in the use of the communications microphone 135 by a user to engage in two-way communications through the wireless transceiver 530. As a result, determining whether or not an intercom system is active or inactive may be of significance only in whether the controller 550 operates the local sidetone generator 520 to provide sidetone, or not.

Figure 4:
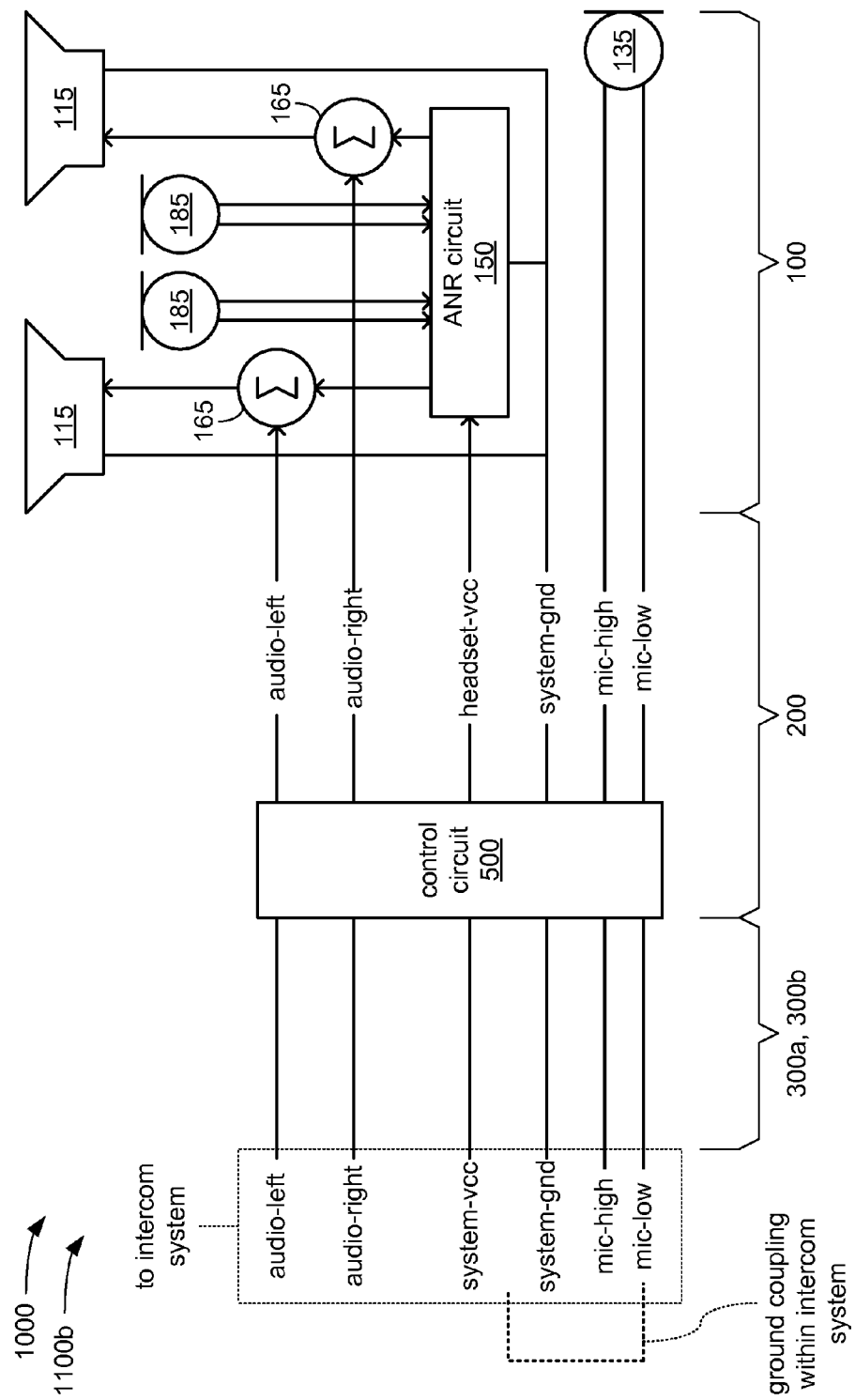
FIG. 4 is a block diagram of another electrical architecture employable in the headset of FIG. 1.

FIG. 4 depicts a possible embodiment of an alternate electrical architecture 1100b that may be employed by the headset 1000. Among the ways in which the electrical architecture 1100b differs from the electrical architecture 1100a (presented in FIG. 3) are the addition of support for one or both of the lower cable assemblies 300a and 300b possibly incorporating a system-vcc conductor to convey electrical power provided by an intercom system or radio (or other form of two-way communications device to which the headset 1000 may be coupled), the addition of active noise reduction (ANR) functionality, and the addition of providing electric power via a headset-vcc conductor to support the ANR functionality. The electrical architecture 1100b, with its various differences from the electrical architecture 1100a, is presented to provide another example embodiment. It should not be assumed that the electrical architectures 1100a and 1100b represent the only possible embodiments of the headset 1000 or that the depicted and described combinations of components and features of each of these electrical architectures are the only such combinations possible. More specifically, it should be noted that although the headset 1000 is depicted as providing feedback-based ANR functionality with components located within the head assembly 100, other embodiments are possible in which other forms of ANR are provided in addition to or as an alternative to feedback-based ANR. Further, other embodiments are possible in which whatever ANR that may be provided is so provided based on components incorporated into the control circuit 500, rather than based on a separate ANR circuit, as depicted. Still further, other embodiments are possible in which electric power is provided via the headset-vcc to the head assembly for an entirely different purpose, such as audio amplification, a volume or tone control, etc.

In employing the electrical architecture 1100b, the headset 1000 incorporates the acoustic drivers 115, the communications microphone 135, the control circuit 500, an ANR circuit 150, a pair of feedback ANR microphones 185 and a pair of summing nodes 165. As was the case in the electrical architecture 1100a, in the electrical architecture 1100b, the control circuit 500 is coupled to the acoustic drivers 115 and the communications microphone 135. Also, and as will be explained in greater detail, power to the whatever components that may be positioned within the head assembly 100 (e.g., the ANR circuit 150 and the summing nodes 165), is provided by the control circuit 500 through the headset-vcc conductor, and that power may either be provided from a power source incorporated into the headset 1000 (e.g., a battery), or may be relayed through the control circuit 500 from an intercom system that provides it via the system-vcc conductor.

As has already been discussed, despite standards that may exist in some industries, it is not uncommon for manufacturers of different ones of vehicles or large pieces of machinery incorporating intercom systems to provide those intercom systems with characteristics that vary among those manufacturers. Among those varying characteristics is whether or not different intercom systems provide electric power to headsets or to other devices coupled to those intercom systems through the connectors provided by those intercom systems. Thus, it may be that the single connector of an intercom system to which the single connector 390 of the lower cable assembly 300a is structured to be coupled does provide electric power via the system-vcc conductor, while neither of the pair of connectors of another intercom system to which the pair of connectors 390 of the lower cable assembly 300b are structured to be coupled provide electric power, or vice versa. As will be explained in greater detail, the control circuit 500 may monitor the system-vcc conductor to at least determine the presence or absence of electric power provided by an intercom system (and perhaps also to measure its voltage). As will also be explained, the control circuit 500 may make use of such electric power provided by an intercom system across the system-vcc conductor to further conserve electric power provided by another power source of more limited capacity (e.g., the local power supply 252 incorporated into the headset 1000). Further, the control circuit 500 may use the presence or absence of such electric power as an aid to determining whether the headset 1000 is coupled to an active intercom system, is coupled an inactive intercom system and/or is not coupled to any intercom system.

Figure 5:
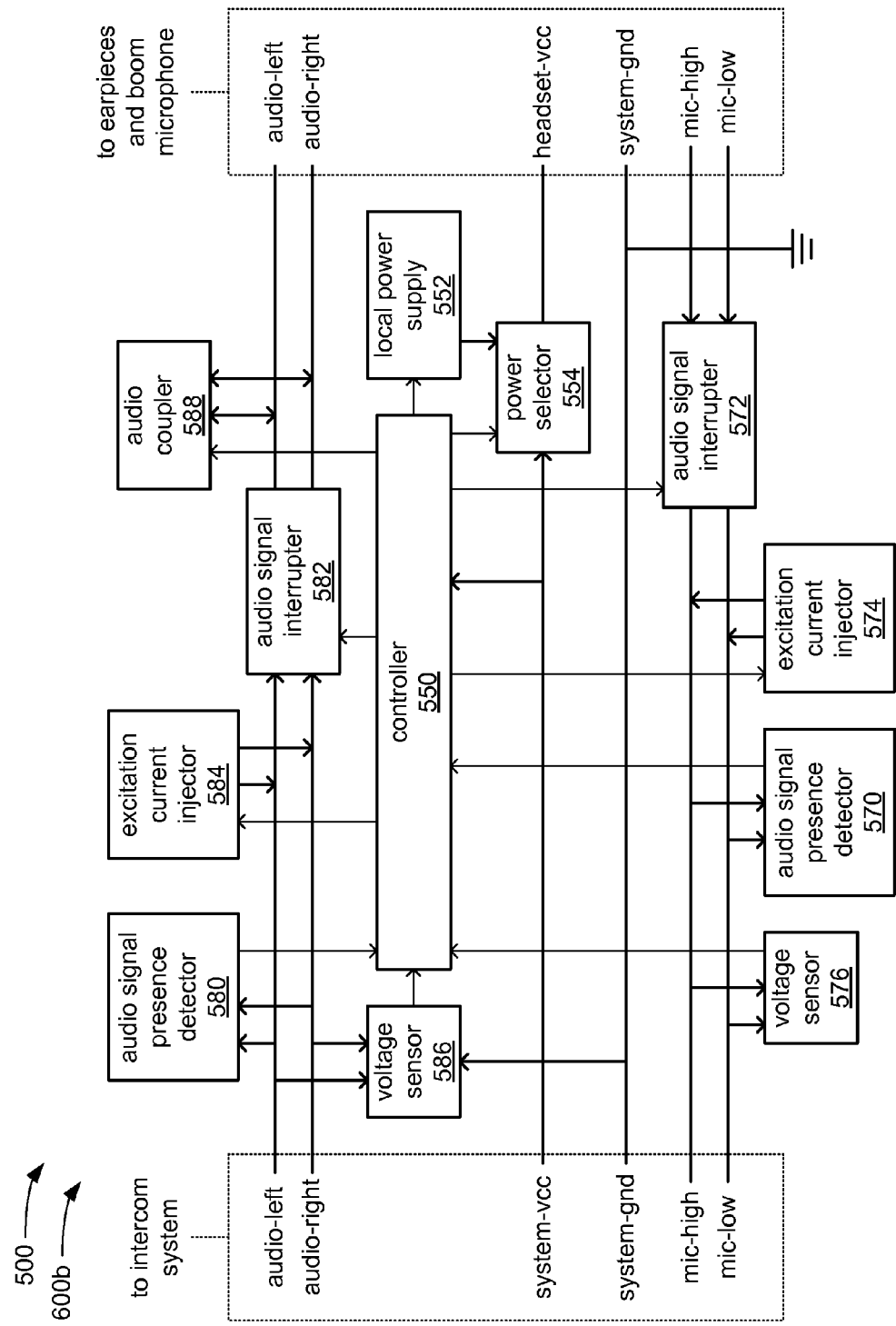
FIG. 5 is a block diagram of a control circuit of the electrical architecture of FIG. 4.

FIG. 5 depicts a possible embodiment of an alternate electrical architecture 600b that may be employed by the control circuit 500. Among the ways in which the electrical architecture 600b differs from the electrical architecture 600a (presented in FIG. 3) are the removal of support for coupling the control circuit 500 to devices other than an intercom system (e.g., either via the auxiliary connector 512 or via the wireless transceiver 530), the addition of support for testing the coupling of microphone-related conductors to an intercom system through an injection of current (previously discussed with regard to the electrical architecture 600a, but not specifically depicted in FIG. 3), and the addition of support for using electric power provided by an intercom system or radio (or other two-way communications device that may provide electric power on the system-vcc conductor when coupled to the headset 1000) on occasions where such power is available. The electrical architecture 600b, with its various differences from the electrical architecture 600a, is presented to provide another example embodiment. It should not be assumed that the electrical architectures 600a and 600b represent the only possible embodiments of the control circuit 500 or that the depicted and described combinations of components and features of each of these electrical architectures are the only such combinations possible.

In employing the electrical architecture 600b, the control circuit 500 incorporates the controller 550, the local power supply 552, a power selector 554, an audio signal presence detector 570, an audio signal interrupter 572, an excitation current injector 574, a voltage sensor 576, the audio signal presence detector 580, the audio signal interrupter 582, the excitation current injector 584, the voltage sensor 586 and an audio coupler 588. As was the case in the electrical architecture 600a, in the electrical architecture 600b, the controller 550 is coupled to many others of these components to monitor and/or control their functions (as will be explained in greater detail). Also, and as will be explained in greater detail, power to these and other components may be provided either by the local power supply 552 or by an intercom system via the system-vcc conductor, as selected by the controller 550. Further, the power provided by the power supply 552 is preferably referenced to the system-gnd conductor, just as any electric power provided by an intercom system through the system-vcc conductor is expected to be.

Just as in the electrical architecture 600a, the audio signal presence detector 580, the audio signal interrupter 582, the excitation current injector 584 and the voltage sensor 586 are able to be operated by the controller 550 in a coordinated manner to perform a test to determine whether the audio-left and/or the audio-right conductors are coupled to an active intercom system, are coupled to an inactive intercom system, and/or are coupled to no intercom system, at all. Similarly, the audio signal presence detector 570, the audio signal interrupter 572, the excitation current injector 574 and the voltage sensor 576 are able to be operated by the controller 550 in a very similar coordinated manner to perform a test to determine whether the mic-high and/or mic-low conductors are coupled to an active intercom system, are coupled to an inactive intercom system, and/or are coupled to no intercom system, at all. For sake of brevity in the following discussion, this test involving these steps of isolating a portion of a conductor meant to be coupled to an intercom or radio from another portion coupled to other components of the headset 1000, injecting a current and measuring the resulting voltage is hereinafter referred to as a "current injection test."

It should be noted that although components and steps for performing a current injection test of only the audio-left, audio-right, mic-high and mic-low conductors are specifically depicted and discussed, a current injection test of either the system-vcc or a push-to-talk conductor (not shown) may also be performed. However, a difference between performing a current injector test on one of the audio-left, audio-right, mic-low and mic-high conductors versus performing a current injector test on one of the system-vcc conductor or a push-to-talk conductor is that awaiting an end to signal activity on the system-vcc and a push-to-talk conductor entails awaiting an end to the provision of power on those conductors. As has been previously discussed at length, the results of a current injection test of whatever conductor may be employed by the controller 550 (either in combination with the results of other tests, or not) to determine which functions of the headset 1000 to enable or disable, and/or which components of the control circuit 500 (or elsewhere within the headset 1000) to turn off (including turning off the headset 1000 by turning off all or nearly all of such components).

In performing a current injection test of one or both of the mic-high and mic-low conductors, the controller 550 operates the audio signal presence detector 570 to monitor the mic-low and mic-high conductors for a period of inactivity in which a user of the headset 1000 is not speaking (i.e., monitoring for an absence of audio signals on the mic-low and mic-high conductors arising from use of the communications microphone 135). Upon determining that such a period of inactivity is taking place, the controller 550 operates the audio signal interrupter 572 to disconnect portions of the mic-low and mic-high conductors that are coupled to the communications microphone 135 from portions of those same conductors that may be coupled to an intercom, and then operates the excitation current injector 574 to inject a current into one or both of the portions of the mic-low and mic-high conductors that may be coupled to an intercom system (and that are now disconnected from the portions coupled to the communications microphone 135). The controller 550 then operates the voltage sensor 576 to monitor whatever voltage may be present across the mic-low and mic-high conductors to determine the impedance between those conductors, and thereby determine at least whether or not the mic-low and mic-high conductors are coupled to an intercom system, and possibly whether or not that intercom system is active. As will be familiar to those skilled in the art, if the portions of the mic-low and mic-high conductors meant to be coupled to an intercom system through a cable (through one of the lower cable assemblies 300a or 300b, or perhaps a different cable) are not actually coupled to an intercom system, there will be a very high resistance (theoretically, a near-infinite resistance) between the mic-low and mic-high conductors such that a relatively high voltage will be found to be present by the voltage sensor 576 across the mic-low and mic-high conductors. However, if these conductors are coupled to an intercom system, then there will be a far lower resistance between the mic-low and mic-high conductors such that a relatively low voltage will be found to be present across them by the voltage sensor 576.

As those skilled in the art will readily recognize, it may not be possible to perform this test in circumstances where the microphone is an electret microphone and the mic-low and mic-high signals are coupled to an intercom that is providing a bias voltage in support of that electret microphone. To accommodate this possibility, the controller 550 may also operate the voltage sensor 576 to monitor the mic-low and mic-high conductors for the presence of a bias voltage, and wait until a time when that bias voltage is no longer present before performing a current injection test of either of these conductors. Thus, the voltage sensor 576 may be employed to perform the same function as the bias voltage detector 590 in the electrical architecture 600a. Damage may result to components of the headset 1000 and/or an intercom system if the controller 550 were to attempt to perform such a current injection test while a bias voltage is being provided across the mic-low and mic-high conductors. Further, the provision of a bias voltage across these conductors may very well be assumed to be an indication that these conductors must be coupled to an active intercom, thereby rendering the performance of such a current injection test unnecessary.

It may be deemed desirable to structure the audio signal detector 570, the audio signal interrupter 572, the excitation current injector 574 and the voltage sensor 576 to interact with the mic-low and mic-high conductors in a manner that is not referenced to the system-gnd conductor. As previously discussed, depending on the design of a given intercom system and depending on which conductors are coupled to that intercom system, the system-gnd conductor may already be coupled to the mic-low conductor through that intercom system. Where this is the case, it may be deemed desirable to avoid additionally coupling the system-gnd and mic-low conductors within the control circuit 500 so as to avoid creating a ground loop between these two conductors that could introduce electrical noise and/or other electrical artifacts into the operation of that intercom and/or the headset 1000.

The audio coupler 588 is operable by the controller 550 to selectively couple the audio-left and audio-right conductors, and it may be possible to employ the results of current injection tests of each of the audio-left and audio-right conductors to detect instances in which only one of these conductors is coupled to an intercom system (or that only one is coupled to an active intercom system). Thus, it may be that the headset 1000 is coupled to an intercom system that outputs only a single audio channel to the headset 1000 (i.e., an intercom system with a "mono" output) such that audio from that intercom system is received on only one of the audio-left and audio-right conductors, leaving the other of these conductors unused. Alternatively and/or additionally, it may be that a particular one of the lower cables 300a or 300b employed in coupling the headset 1000 to an intercom system is capable only of conveying audio on one of these conductors, or it may be that an intercom system that would normally be expected to output audio on both of these conductors is malfunctioning in some way or is in some other way being prevented from doing so (e.g., a connector of the intercom is incorrectly wired). Still other possible scenarios for a lack of provision of audio on both of these conductors will occur to those of ordinary skill in the art. Regardless of the circumstances causing audio to be provided from an intercom system on only one of the audio-left and audio-right channels, upon the detection of this circumstance, the controller 550 may operate the audio coupler 588 to couple both of the audio-left and audio-right conductors together so that the audio provided by an intercom system on only one of these conductors will also be provided on the other through the audio coupler 588.

Further, where the controller 550 has operated the audio coupler 588 to couple the audio-left and audio-right conductors, the controller 550 may also operate the audio signal interrupter 582 to continuously disconnect the two portions of whichever one of the audio-left and audio-right conductors is found to not be providing audio from an intercom system. This may be done to prevent damage to components of either the intercom system or of the headset 1000 if the intercom system should unexpectedly begin providing audio (perhaps intermittently, where there is a malfunction of some sort) on both of these conductors while they are coupled through the audio coupler 588. This may also be done to enable the controller 550 to repeatedly perform current injection tests of the disconnected portion of the one of these conductors that may be coupled to an intercom system, but that does not have audio activity thereon, for an indication of audio once again being provided by an intercom system on that portion such that audio may once again be provided by an intercom system on both of the audio-left and audio-right conductors. Through such use of the audio signal interrupter 582 and the audio coupler 588, and through such use of current injection tests, the headset 1000 is made capable of automatically adjusting to changes in the provision of audio on either one of these conductors or on both of these conductors.

The controller 550 is able to monitor the system-vcc conductor for the presence or absence of electric power being provided by an intercom system. As previously mentioned, where an intercom system to which the headset 1000 is coupled provides electric power, it may be deemed desirable to make use of the electric power provided by that intercom system in order to conserve the electric power provided by the local power supply 552, especially where the local power supply 552 is a battery or other form of power source having a limit on its capacity to provide electric power. Thus, upon sensing the presence of electric power being provided by an intercom on the system-vcc conductor, the controller 550 may operate the power selector 554 to select the power provided on the system-vcc conductor to be used to provide power to an amplifier or other circuit that may be present within the head assembly 100 to drive the acoustic drivers 115, and/or to other components of the headset 1000 requiring electric power, including various components of the control circuit 500. Alternatively and/or additionally, the power selector 554 may select between the use of power provided through the system-vcc conductor and power provided by the local power source 552, autonomously, and outside the control of the controller 550. This autonomous operation may be deemed desirable where the controller 550 may be engaged in performing a number of tasks at any given time such that the controller 550 may not respond quickly enough to a loss of power from one or the other of these two sources to switch to relying on the other of these two sources to avoid losing power, itself.

It is preferred that the controller 550 relies on more than one form of test to determine whether the headset 1000 is coupled to an intercom system, or not, and perhaps to additionally determine whether the intercom that the headset 1000 may be coupled to is active, or not, thereby enabling the controller 550 to determine when it is appropriate to enable and/or disable various functions, and/or to turn various components on and/or off, including when it is appropriate to turn all or substantially all of the headset 1000 on and/or off. Among the various tests that have been discussed that the controller 550 may rely upon in any of a number of possible combinations are monitoring the mic-low and mic-high conductors for the presence of a bias voltage, monitoring the system-vcc conductor for the presence of electric power, monitoring the audio-left and/or audio-right conductors for activity as various tests to determine, and current injection tests of one or more of the audio-left, audio-right, mic-low, mic-high and system-vcc conductors (and possibly a push-to-talk conductor, if present—not shown).

As has been previously discussed, some of these tests may only be useful in confirming that the headset 1000 is coupled to an active intercom system, and may in no way be reliable in confirming that the headset 1000 is not coupled to an active intercom. Such tests include the monitoring of the mic-low and mic-high conductors for the presence of a bias voltage, since the absence of a bias voltage may simply be due to the use of dynamic microphone or the lack of coupling of only the mic-low and mic-high conductors to an intercom system (while other conductors are coupled to an intercom system), and therefore, may not be due to the headset 1000 being coupled to an inactive intercom system or to no intercom system, at all. Such tests also include the monitoring of the system-vcc conductor for the presence of electric power provided by an intercom system, since the absence of such electric power may simply be due to the use of cabling and/or connectors that don't support conveying electric power from an intercom system to a headset. Such tests further include the monitoring of the audio-left and/or the audio-right conductors for the presence of audio signal activity. Thus, where these two tests are concerned, it is possible to confirm a "positive" insofar as the presence of a bias voltage, electric power or audio signal output from an intercom system may be assumed to confirm that the headset 1000 is coupled to an active intercom system, but it is not possible to confirm a "negative" insofar as the absence of a bias voltage, electric power or audio signal output from an intercom system may be due to any of a variety of causes other than the headset 1000 not being coupled to an active intercom system.

Still another test may be monitoring a push-to-talk conductor (not shown) for the presence of a pull-up voltage. As will be familiar to those skilled in the art, it is commonplace for a push-to-talk feature of intercom systems and of two-way radios to be operated by coupling a push-to-talk conductor to a ground conductor (perhaps the system-gnd conductor) to enable a user (perhaps the communications microphone 135 of the headset 1000) to speak. Therefore, where there is a coupling to such an intercom system or radio through a push-to-talk conductor, there should be a voltage provided on the push-to-talk conductor by a pull-up resistor of that intercom system or two-way radio.

Figure 6A:
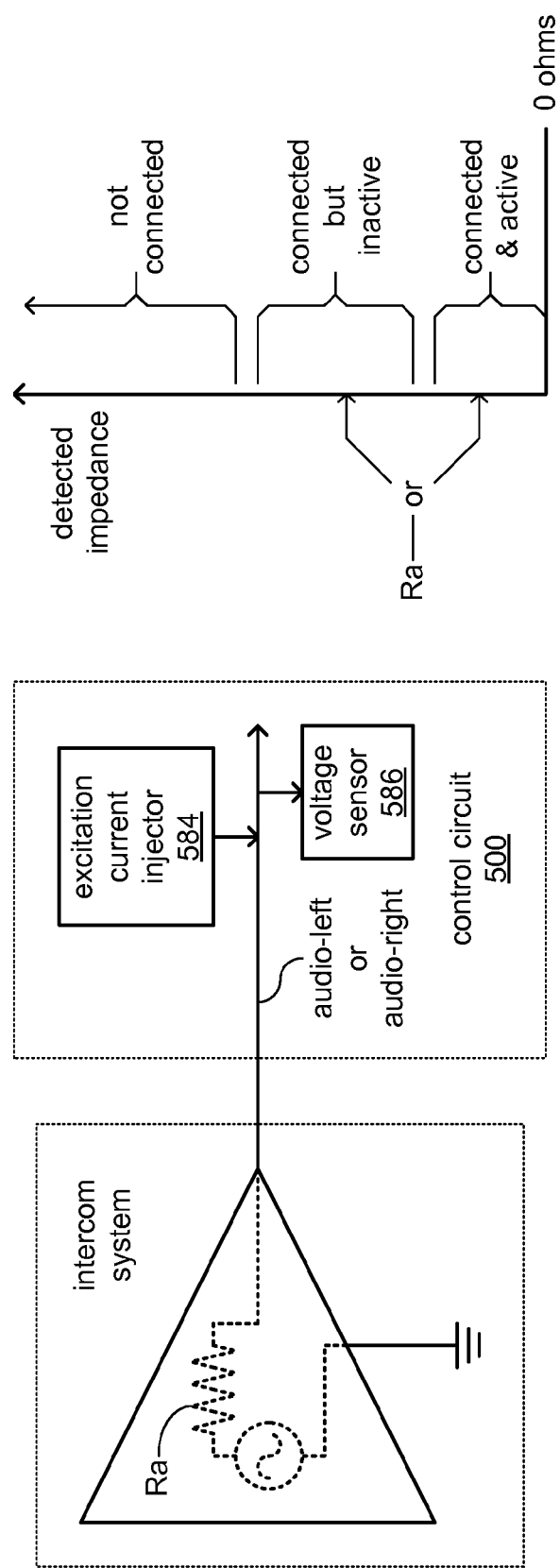
FIGS. 6a through 6c are block diagrams of aspects of testing a conductor of the headset of FIG. 1 for possible coupling to an active or inactive intercom system.
Figure 6B:
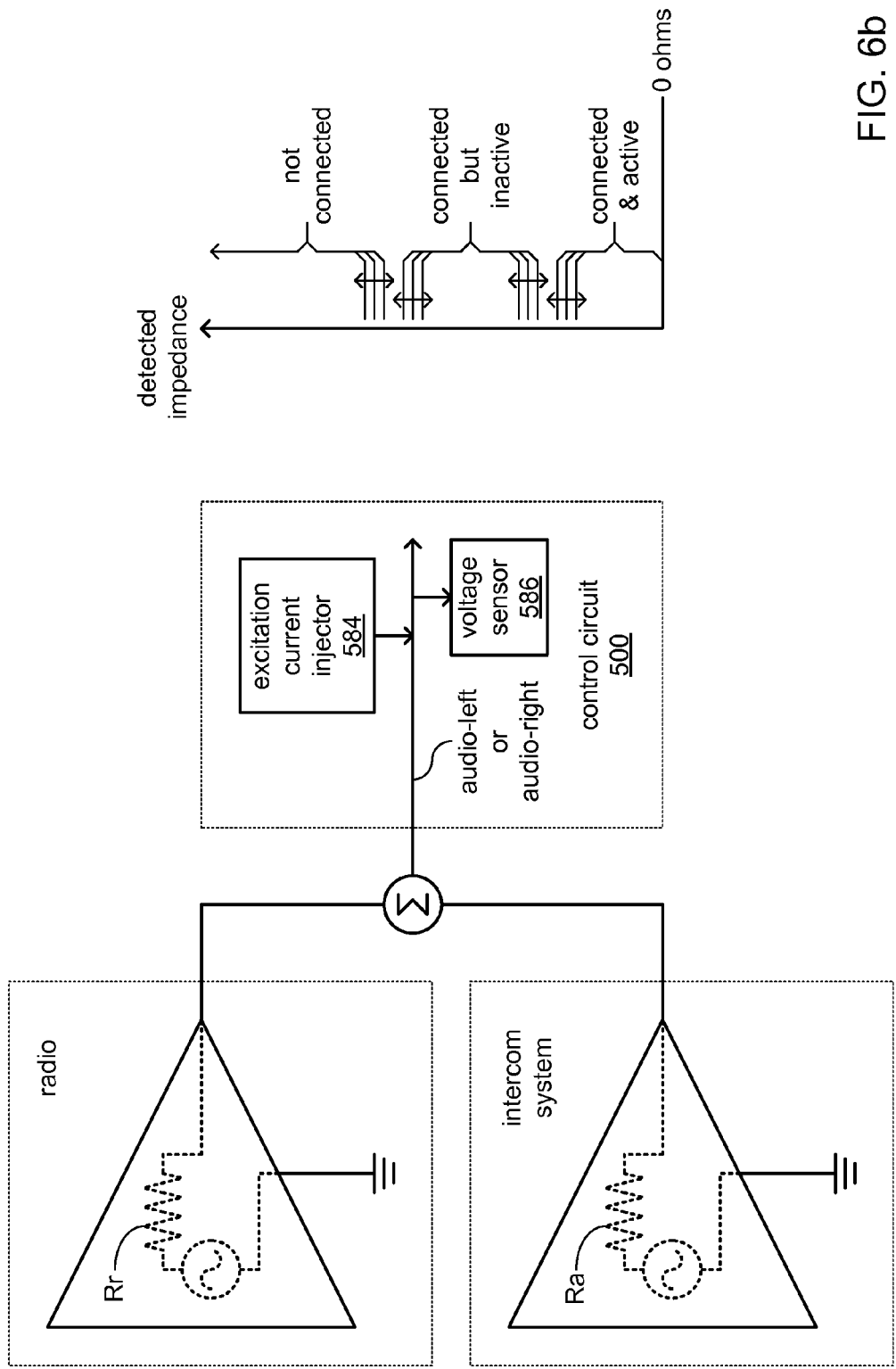
Figure 6C:
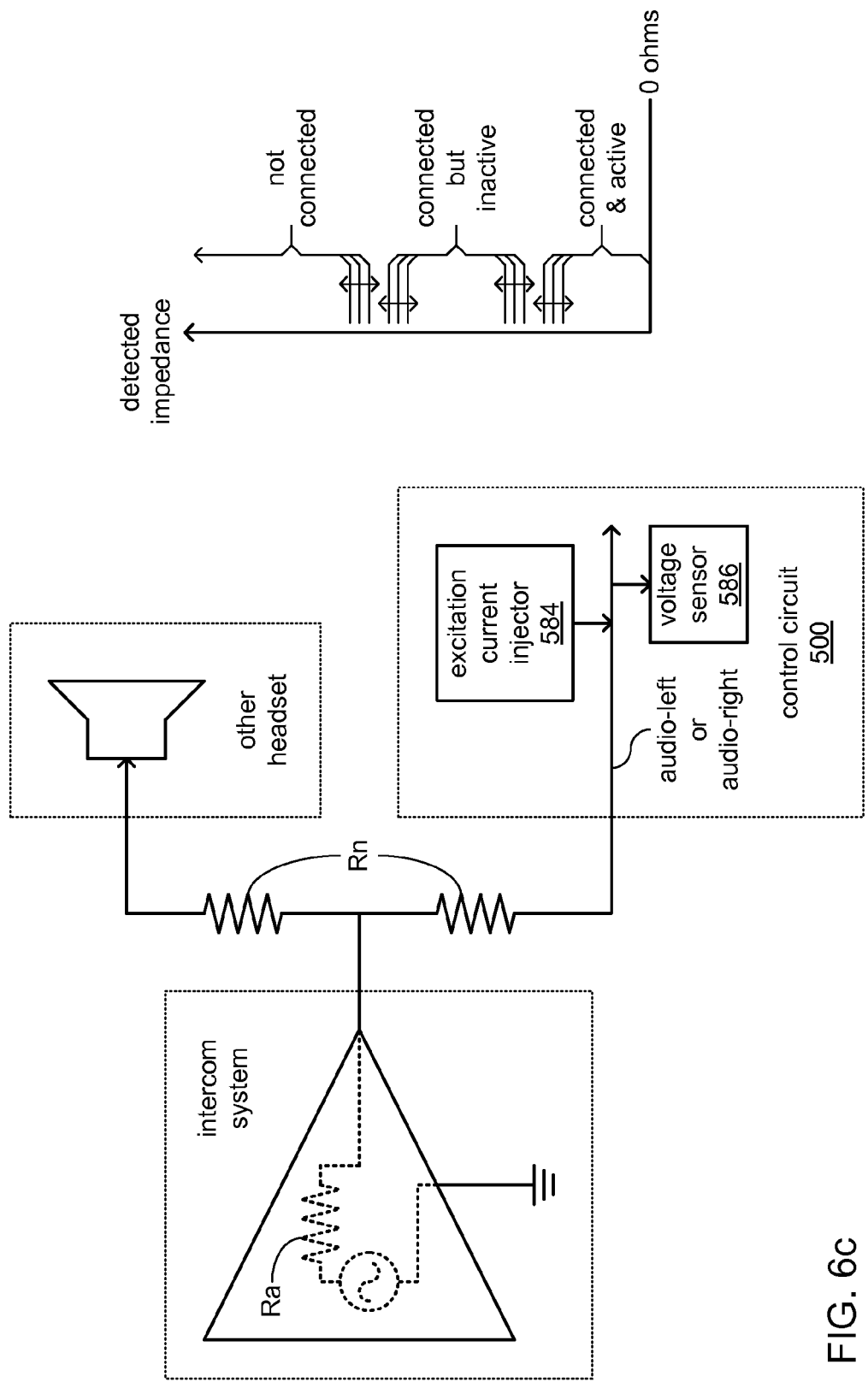

FIGS. 6a, 6b and 6c depict various aspects of the controller 550 of either of the electrical architectures 600a or 600b performing a current injection test of one of the audio-left or audio-right conductors as part of determining whether the tested conductor is coupled to an active intercom system, an inactive intercom system or no intercom system, at all. For the sake of ensuring accuracy in distinguishing each of these possible situations from the other, it is preferred that the amount of current injected by the current injector 584 and the maximum voltage output of the current injector 584 relative to the system-gnd conductor both be known quantities. In accordance with Ohm's law, V=IR (where V is voltage, I is current, and R is resistance), the higher the voltage V detected by the voltage sensor 586 on the tested conductor relative to the system-gnd conductor, the higher the resistance R between that tested conductor and the system-gnd conductor for a given current I injected into that tested conductor by the excitation current injector 584. Thus, where the controller 550 operates the excitation current injector 584 to inject a known current into the tested conductor, the controller 550 is able to employ Ohm's law to use the known current output of the current injector 584 and the voltage measured by the voltage sensor 586 to determine the amount of resistance between the tested conductor and the system-gnd conductor.

Turning to FIG. 6a, details are depicted of what within an intercom system is actually coupled to the tested one of the audio-left or audio-right conductor in a simple case of that tested conductor being coupled to that intercom system. In this simple case, the output of an audio amplifier of the intercom system is coupled directly to the tested conductor in order to drive that conductor with an analog audio signal meant to cause acoustic output by one of the acoustic drivers 115. In theory, the output of an ideal audio amplifier should function as an ideal voltage source that has zero resistance across its terminals when active such that there is zero resistance between the tested conductor and the system-gnd conductor. However, in practical reality, although the audio amplifier's output may closely resemble a voltage source in its behavior, there will be some small and measurable resistance Ra between the audio amplifier's output and the system-gnd conductor. Where the depicted intercom system is incorporated into an aircraft, there is wide adoption of a Technical Standard Order (TSO) promulgated by the Federal Aviation Administration of the U.S. Government within general aviation that recommends that the output of an audio amplifier of an intercom system have a resistance Ra to the system-gnd conductor of less than 20 ohms. Thus, where it is possible to assume that the intercom system depicted in FIG. 6a is compliant with this TSO, where the audio amplifier of that intercom system is active, and where the tested conductor is coupled to the output of that amplifier, a current injection test of the tested conductor should result in a determination of there being less than 20 ohms resistance between the tested conductor and the system-gnd conductor (i.e., the resistance between the tested conductor and the system-gnd conductor should be Ra, with Ra being less than 20 ohms).

However, although the behavior of the output of the audio amplifier should closely resemble that of a voltage source with a relatively low resistance to the system-gnd conductor at a time when the audio amplifier is active, as has been mentioned earlier, the behavior of an inactive audio amplifier is rather different. Where the audio amplifier of this simple case intercom system depicted in FIG. 6a becomes inactive (i.e., the audio amplifier is turned off such that it is no longer being provided electric power), the output of the audio amplifier ceases to behave like a voltage source, and instead, behaves as a resistor of a higher resistance value (than when active) coupling the tested conductor to the system-gnd conductor. The same TSO that specifies the resistance between the audio amplifier's output and the system-gnd while active provides no specification of what the resistance should be when the audio amplifier is inactive. However, observations of audio amplifiers incorporated into actual intercom systems aboard a number of airplanes has shown that this resistance is usually within the range of 500 to 2000 ohms. Thus, where Ra of the amplifier depicted in FIG. 6a is less than 20 ohms while the amplifier is active (if TSO-compliant), Ra changes to a higher resistance that is likely to be within the range of 500 to 2000 ohms when the amplifier is inactive. Thus, where that audio amplifier is inactive and where the tested conductor is coupled to the output of that amplifier, a current injection test of the tested conductor should result in a determination of there being a resistance in the range of 500 to 2000 ohms between the tested conductor and the system-gnd conductor (i.e., the resistance between the tested conductor and the system-gnd conductor should be Ra, with Ra having become a resistance in the range of 500 to 2000 ohms).

Aside from the tested conductor being coupled to the output of that amplifier at a time when it is active or at a time when it is inactive, there is also the possibility of the tested conductor being coupled to no intercom system, whatsoever, such that the tested conductor is not coupled to an output of any audio amplifier. In theory, with the tested conductor coupled to no intercom, at all, the resistance between the tested conductor and the system-gnd conductor should be infinitely high. However, in practical reality, the resistance between the tested conductor and the system-gnd conductor will simply be very, very high such that the voltage that is measured by the voltage sensor 586 should be at least quite close to the maximum voltage output of the excitation current injector 584 relative to the system-gnd conductor. It should be noted that the excitation current injector 584 should be designed such that the maximum voltage output of the excitation current injector 584 is high enough that the maximum voltage output is not reached with the range of resistances that are expected to be encountered at a time when the tested conductor is coupled to the output of the audio amplifier and the audio amplifier is inactive. Otherwise, it will not be possible to distinguish between the tested conductor being coupled to an output of an inactive audio amplifier and not being coupled to an audio amplifier output, at all.

Given these details of these three expected outcomes of a current injection test of the tested one of the audio-left or audio-right conductors, the results should be one of Ra having a resistance of less than 20 ohms or less, Ra having a resistance within a range of higher resistances (e.g., 500 ohms to 2000 ohms, for example), or Ra having an extremely large resistance. These three outcomes make possible the setting of up to three ranges of resistance against which the resistance that is found to be present on a tested one of the audio-left and audio-right conductors can be compared to determine whether the tested conductor is coupled to an active intercom system having an active audio amplifier output, to an inactive intercom system having an inactive audio amplifier output, or to no intercom system (and therefore, no audio amplifier output), at all. FIG. 6a depicts an example of defining three such ranges of resistance, with two of these ranges being selected to coincide with the expected lowest resistance associated with being coupled to an active audio amplifier and the expected somewhat higher resistance associated with being coupled to an inactive audio amplifier. It should be noted that these three ranges of resistances need not form an unbroken continuum of resistance values, i.e., these three ranges of resistance values may be separated by other ranges of resistance values between them.

Turning to FIG. 6b, although an audio amplifier of an intercom system may have resistance characteristics that are known (perhaps as a result of following a widely adhered-to standard, such as a TSO from the FAA in the case of an intercom system incorporated into an airplane), other components may be interposed between such a predictable audio amplifier and a tested one of the audio-left and audio-right conductors such that unpredictable results occur. More specifically, FIG. 6b depicts a less simple case of the summing of the output of the audio amplifier first depicted in FIG. 6a with the output of a radio having an unknown resistance Rr between its output and the system-gnd conductor. This more complex case is occurring with greater frequency in general aviation where it is desired to increase the failsafe nature of the operation of aircraft during instances where a power failure of a main power source (e.g., a generator coupled to an aircraft's engine) occurs. Where such a loss of power occurs, electric power for an intercom system is typically entirely lost, while radios employed in communicating with air traffic control often have a built-in backup battery to maintain their operation.

Normally, the audio signal output of a radio is summed with intercom system audio, and the summed results are provided to an audio amplifier of an intercom system as an input, and therefore, the output of that audio amplifier is the only audio signal that is driven onto one of the audio-left or audio-right conductors. However, in growing recent trend, the audio signal output of the radio is also being summed with the output of the same audio amplifier in a switchable manner that allows the audio signal output of the radio to bypass that audio amplifier in instances where that audio amplifier loses power as part of a larger loss of power within an airplane. Unfortunately, there does not yet appear to be a widely accepted common specification for the electrical characteristics of such a summing node. Thus, summing nodes implemented in greatly differing ways have been observed, including resistor networks, relay switches, various forms of transistor, etc. As a result, the resistance between a tested one of the audio-left and audio-right conductors that is coupled to an intercom system and the system-gnd conductor may be increased by a resistance of the summing node being added in series with the resistance Ra of the audio amplifier of the intercom system, and/or may be decreased by a resistance Rr of the radio being added in parallel with the resistance Ra of the audio amplifier. Further unpredictability may arise from the radio being able to be turned on or off, such that the resistance Rr between the output of the radio and the system-gnd changes unpredictably from a relatively low resistance (perhaps close to 20 ohms) with the radio is turned on to an unknown greater resistance with the radio turned off.

Such unpredictability makes the upper and lower bounds of the three ranges of resistances that correlate to the three expected outcomes of performing a current injection test on one of the audio-left or audio-right conductors more difficult to discern, since the changeable resistance that may be added by a summing node and/or a radio would effectively move those upper and lower bounds about, as shown in FIG. 6b. Worse still, it is possible that at least two of these ranges may overlap such that a resistance that falls within such an overlap between two of these ranges would not provide a clear indication of whether the tested conductor is coupled to an active intercom system, an inactive intercom system, or to no intercom system, at all. In other words, the results of such current injection testing would be ambiguous.

Turning to FIG. 6c, another case is depicted in which components may be interposed between an audio amplifier that may have predictable characteristics and a tested one of the audio-left and audio-right conductors such that unpredictable results occur. More specifically, FIG. 6c depicts a case of a common, yet less than ideal, approach to splitting the audio signal output of an audio amplifier of an intercom system between two headsets to enable two persons to listen to what is said in a conversation on an intercom system without installing additional audio amplifiers for each headset being added (which would be the preferable approach). A pair of resistors having an unknown resistance Rn are coupled to the output of the audio amplifier of an intercom system to split that output to enable the connection of two headsets. This is often done in an effort to avoid overloading the current limitations of the output of an audio amplifier by adding some amount of resistance Rn between the output of the audio amplifier and each headset.

Unfortunately, there appears to be no widely-accepted standard for the amount of the resistance Rn to be provided by each such resistor, so the resistance Rn added in series to the resistance Ra is often unpredictable. Also, it is typical for each headset that may be coupled to the same output of the same audio amplifier through such resistors to be separately able to be coupled or uncoupled from the intercom system at anytime by whoever is using it, so it is unpredictable whether the additional resistance that may be add in parallel to the resistance Ra of the amplifier will be present, or not.

Again, such unpredictability makes the upper and lower bounds of the three ranges of resistances that correlate to the three expected outcomes of current injection testing of one of the audio-left or audio-right conductors more difficult to discern, and again, it is possible that at least two of these ranges may overlap such that a resistance that falls within such an overlap between two of these ranges would not provide a clear indication of whether the tested conductor is coupled to an active intercom system, an inactive intercom system, or to no intercom system, at all.

FIGS. 7, 8 and 9a-b depict aspects of ways in which the issues depicted in FIGS. 6b and 6c that can be encountered in performing a current injection test on one of the audio-left or audio-right conductors may be addressed through adaptively setting a threshold voltage that is subsequently used in distinguishing between at least two of the three possible outcomes of a current injection test. More precisely, repeated performances of current injection testing are employed to adaptively set a threshold voltage and to compare that threshold voltage to subsequent measured voltages resulting from subsequent performances of current injection tests. The outcome such a comparison is employed in determining at least whether or not a tested one of the audio-left or audio-right conductor is coupled to an active intercom system, and perhaps also whether or not the tested conductor is coupled to an inactive intercom system or to no intercom system, at all.

Figure 7:
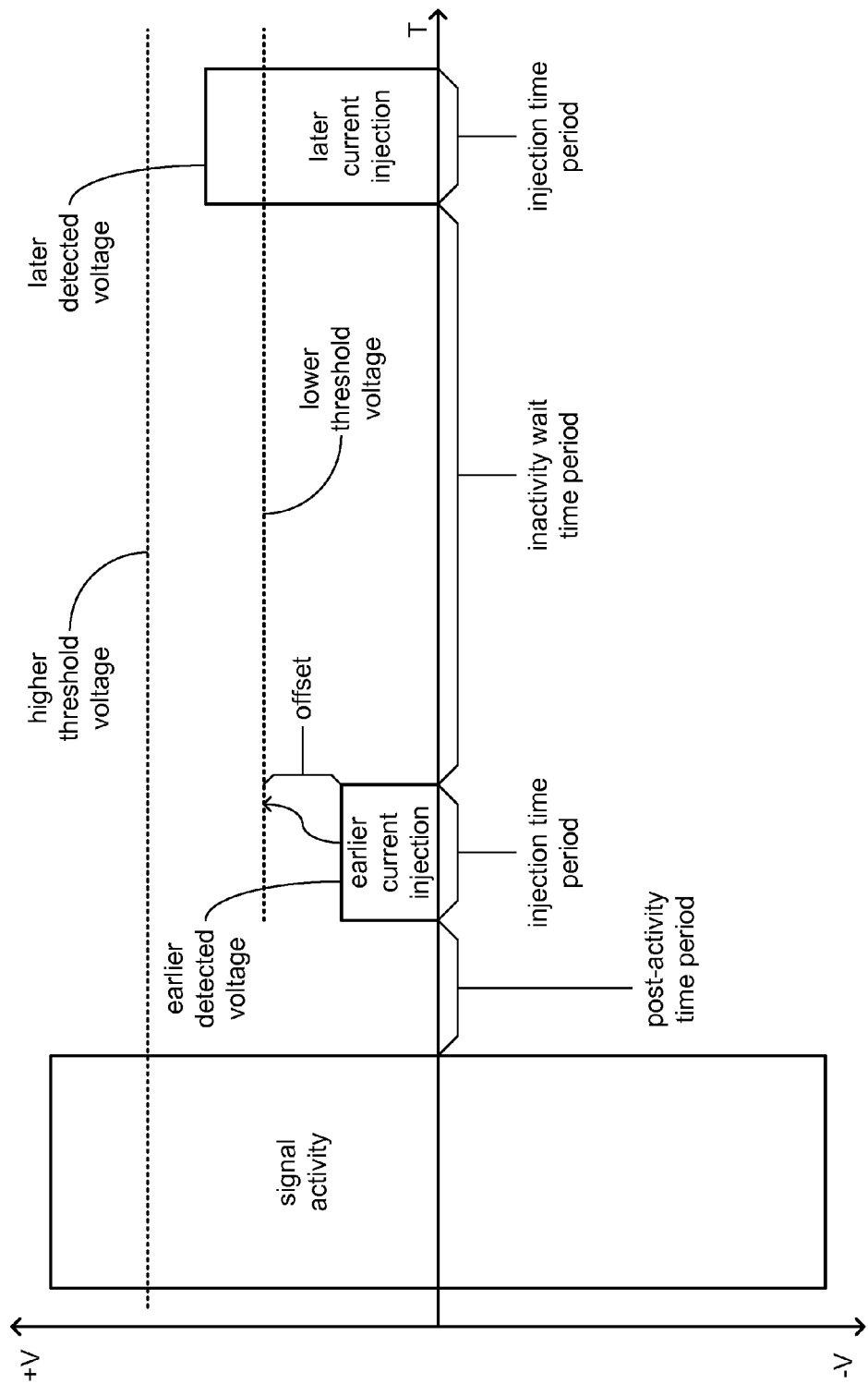
FIG. 7 is a graph of the performance of an embodiment of a test of a conductor by injection of current by the control circuit of either FIG. 3 or FIG. 5, and use of the results of this embodiment of the test.

Turning to FIG. 7, details are depicted of a simple embodiment of two performances of a current injection test in which a threshold voltage is set in an earlier performance and is subsequently used for comparison in a later performance. At the moment where audio signal activity (representing audio for a user of the headset 1000 to hear through an acoustic driver 115) on the tested one of the audio-left or audio-right conductors comes to an end, the audio signal presence detector 580, detects this ending, and the controller 550 then waits through a post-activity time period before taking action in response.

The length of this post-activity time period is selected to be short enough that the earlier performance of the current injection test is performed quickly enough following the end of signal activity that a user of the headset 1000 will not likely yet have had time to uncouple any portion of the headset 1000 from an intercom system, but long enough to ensure that this detected end of audio signal activity isn't simply the start of a very brief pause between words being spoken in order to attempt to avoid having this test being performed in the middle of a conversation. Having the earlier performance of the current injection test occur quickly after the end of audio signal activity is important to ensuring that it does take place while the tested conductor is actually coupled to an active intercom system. In this way, there will be reasonable certainty that the voltage measured during this early performance of the current injection test does corresponds to the tested one of these conductors being coupled to an active intercom system.

After passage of post-activity time period, the controller 550 operates the signal interrupter 582, the excitation current injector 584 the voltage sensor 586 to carry out the earlier performance of the current injection test of the tested conductor. The controller 550 operates the current injector 584 for a predetermined period of time that is selected to be long enough to ensure that whatever voltage results from this current injection test will reach a stable voltage level at the time the controller 550 operates the voltage sensor 586 to measure the resulting voltage to ensure accuracy of measurement, but short enough to minimize any disruption of any audio signal activity that might commence during this earlier performance of the current injection test.

The level of voltage detected by the voltage sensor 586 during this earlier performance of the current injection test is employed by the controller 550 to set the lower threshold voltage. Again, the voltage level detected by the voltage sensor 586 during each current injection test corresponds through Ohm's law to the resistance between the system-gnd conductor and the tested conductor. The controller 550 calculates the lower threshold voltage by adding an offset voltage to the voltage level detected by the voltage sensor 586 during testing. The offset voltage corresponds to a predetermined amount of offset resistance that is selected to overcome the possibility of small fluctuations in the amount of resistance that might occur at times when the tested conductor is coupled to an active intercom system.

With the lower threshold voltage having been set, the controller 550 waits for up to the limit of an inactivity wait time period before making a later performance of this test. The length of the inactivity wait time period is selected to provide an interval of time from a previous performance of the current injection test before it is repeated to determine if there has been a change in the resistance consistent with a change in whether the tested conductor is coupled to an active intercom system, an inactive intercom system or no intercom system, at all. In this embodiment, if audio signal activity is detected by the audio signal presence detector 580 before the full length of the inactivity wait time period has elapsed, then the current injection test will not be repeated until after the end of that audio signal activity, and when it is repeated, the resulting measured voltage will again be used to set the lower threshold voltage.

However, if audio signal activity is not detected by the audio signal presence detector 580 before the full length of the inactivity wait time period has elapsed, then the later performance of the current injection test for the purposes of making a comparison of voltages is carried out by the controller 550, as depicted in FIG. 7*a*. If, in this later performance of the current injection test, the voltage level detected by the voltage sensor 586 were below the lower threshold voltage, then the tested conductor would be determined by the controller 550 to still be connected to an active intercom system. The controller 550 would then wait through another passage of the inactivity wait time period before repeating the later performance of the current injection test to again compare voltages. However, as depicted in FIG. 7*a*, the voltage level measured by the voltage sensor 586 during this later performance of the current injection test is found to be greater than the lower threshold voltage, thereby indicating at least that the tested conductor is no longer coupled to an active intercom system.

In some variants of this embodiment, the controller 550 may respond to the indication that the tested conductor is no longer coupled to an active intercom system by immediately turning off at least one component of the headset 1000 (e.g., the transceiver 530) and/or by immediately disabling at least one feature (e.g., provision of ANR). This may be done where the disconnection of the tested conductor from an active intercom system is deemed an indication that the headset 1000 is no longer being used. Further, this outcome of the later performance of the current injection test may be combined with results of one or more other tests (e.g., whether a bias voltage is present across the mic-low and mic-high conductors, whether electric power is being provided on the system-vcc conductor, etc.) to determine what components are to be turned off and/or what features are to be disabled. This may be done in recognition of a possibility that a user of the headset has uncoupled only some of the conductors that are meant to be coupled to an active intercom system, while leaving others still coupled, in order to use some of the functionality of that intercom system (e.g., having only one of the two connectors 390 of the lower cable assembly 300*b* coupled to an intercom system). Thus, where other tests indicate that some other coupling with an active intercom system is still being maintained, this indication that the tested conductor is no longer coupled to an active intercom system may not be responded to by the controller 550 as if the headset 1000 had been entirely uncoupled from an intercom system, and therefore, would at least refrain from turning off all or substantially components of the headset 1000.

In other variants of this embodiment, the controller 550 may respond to this indication that the tested conductor is no longer coupled to an active intercom system by performing one or more repetitions of the later performance of the current injection test in which the lower threshold voltage is again compared to whatever voltage is measured in those repetitions to determine whether or not the tested conductor continues to not be coupled to an active intercom system. This may be done where it is deemed possible that a user of the headset 1000 has only momentarily uncoupled the tested conductor, perhaps as part of moving about within a personnel cabin within a vehicle equipped with an intercom system, or moving about to a different position relative to a piece of farm machinery equipped with an intercom system. It may be deemed desirable to continue to provide power to all or substantially all of the components of the headset 1000 and/or to continue to enable all or substantially all of the features of the headset 1000 for some period of time after this indication that the tested conductor is no longer coupled to an intercom system so that the a user's use of the headset 1000 is not interrupted as a result of only briefly uncoupling the headset 1000 from an intercom system.

In still other variants of this embodiment, how the controller 550 responds to this indication that the tested conductor is no longer coupled to an active intercom system may depend on whether the voltage level detected by the voltage sensor 586 during the later performance of this test also exceeded a higher threshold voltage. As has been previously discussed, it is expected that the maximum voltage supportable by the excitation current injector 584 would be reached where the tested conductor is not coupled to any intercom system, at all. Thus, in these other variants of this embodiment, a higher threshold voltage may be defined that has a voltage level just below the maximum voltage supportable by the excitation current injector 584 to be used in distinguishing the coupling of the tested conductor to an inactive intercom system from not being coupled to any intercom system. Thus, where the voltage level detected by the voltage sensor 586 is found to be above the lower threshold voltage, but below the higher threshold voltage, it may be determined by the controller 550 that the tested conductor is coupled to an intercom system, but that the intercom system is inactive. And thus, where the voltage level detected by the voltage sensor 586 is found to be above both the lower and higher threshold voltages, it may be determined by the controller 550 that the tested conductor is not coupled to any intercom system. In these other variants, this distinction between being coupled to an inactive intercom system versus being couple to no intercom system, at all, may be employed in determining what components are to be turned off and/or what features are to be disabled. For example, a determination that the tested conductor is not coupled to any intercom system may lead to the controller 550 (either immediately or after some delay) turning off all or substantially all of the components of the headset 1000, while a determination of being coupled to an inactive intercom system may lead to the controller 550 (either immediately or after some delay) to turn off fewer components.

Figure 8:
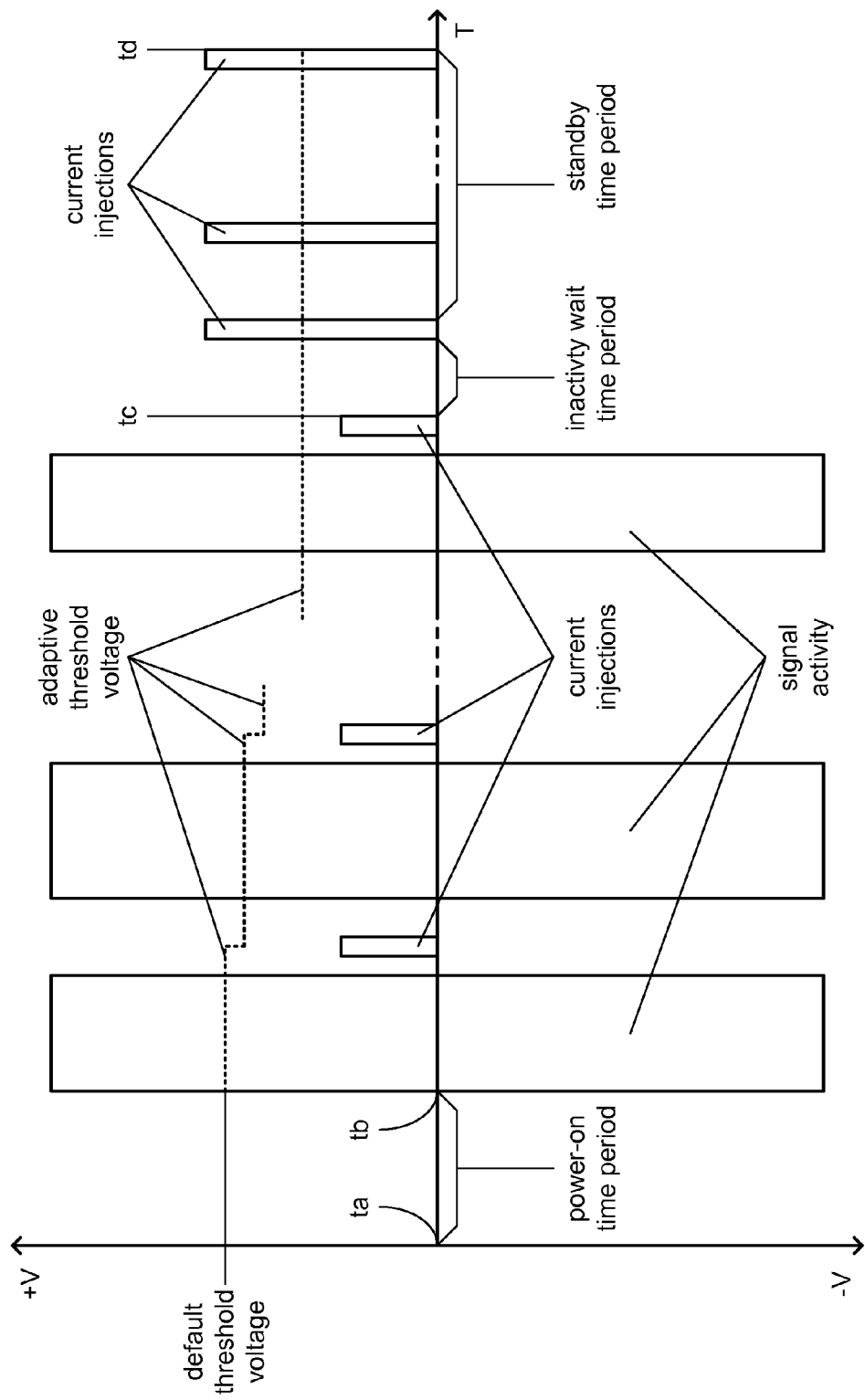
FIG. 8 is a graph of an embodiment of multiple performances of testing a conductor by injection of current by the control circuit of either FIG. 3 or FIG. 5, and multiple uses of the results of this embodiment of the test.

Turning to FIG. 8, details are depicted of a more complex embodiment in which an adaptive threshold voltage is set based on an average of multiple performances of a current injection test before being subsequently used in a later performance to make a comparison. At time ta, the headset 1000 is turned on, and for the duration of a power-on time period extending from time ta to time tb, none of the various tests that have been discussed (e.g., monitoring the mic-low, mic-high, audio-left and/or audio-right conductors for activity or injecting current into any of them; monitoring the mic-low and mic-high conductors for a bias voltage; monitoring the system-vcc for the provision of electric power; etc.) are performed. It may be deemed desirable to provide such a power-on time period of a predetermined few minutes in length (e.g., three minutes) in which no such tests take place to avoid having the controller 550 attempting to respond to spurious or rapidly changing indications of whether the headset 1000 is coupled to an intercom system, or not. Such spurious or rapidly changing indications may be expected to occur as the user of the headset 1000 repeatedly couples and uncouples it to and from an intercom system as they get themselves ready to operate the vehicle or large piece of machinery into which the intercom system has been incorporated. In essence, the provision of the power-on time period allows a user to "settle down" to performing whatever task is at hand that requires the use of the headset 1000.

Then, from time tb to time tc is the period during which a user makes normal use of the headset 1000. Depending on what the user is doing (e.g., flying an airplane, driving a piece of farm machinery, operating a large piece of industrial workshop machinery, etc.), this period of time from time tb to time tc could be of almost any length from mere minutes to multiple hours, or perhaps longer. In short, the duration of this period of time is dictated by the user's actions, and is therefore, likely to be unpredictable.

During this time period from time tb to time tc, instances of signal activity are expected to occur on a conductor to be tested using a current injection test. Of course, such activity is expected to occur as a result of the user employing the headset 1000 in two-way voice communications. As has already been discussed with regard to the embodiment of FIG. 7a, periods of audio signal activity are employed as an indicator of when best to perform a current injection test to obtain a voltage measurement for use in setting an adaptive threshold voltage in an effort ensure that a current injection test is performed on a conductor at a time when the conductor is likely still coupled to an active intercom system, since presumably, the user of the headset 1000 will not yet have had an opportunity to uncouple it the tested conductor.

However, in this more complex embodiment depicted in FIG. 7b, the adaptive threshold voltage is initially set to a default threshold voltage as a result of the headset 1000 being turned on (i.e., "powered on"). The default threshold voltage is a predetermined voltage level that is preferably set by the manufacturer of the headset 1000 (though it could conceivably be made to be set by a user in some possible embodiments) based on measurements of resistances found to exist in a sampling of intercom systems in use by potential users. The intent of having a default threshold voltage is to begin the operation of the headset 1000 with the adaptive threshold voltage already set to a level that is believed to be likely to function correctly with the majority of intercom systems to which the headset 1000 is likely to be coupled. As a result, the current injection testing never provides the initial setting of the adaptive threshold voltage, but instead, repeatedly refines the level of the adaptive threshold voltage to adapt the adaptive threshold voltage to the resistance encountered in the tested conductor being coupled to the intercom system.

Also, in this more complex embodiment, multiple ones of the measurements of voltage levels made by the voltage sensor 586 are averaged together in repeatedly setting the adaptive threshold voltage to new voltage levels in response to each of the current injection tests that is performed following an instance of audio signal activity on the tested one of the audio-left or audio-right conductors. It is preferred that a "rolling average" be used, in which a predetermined quantity of the most recent voltage measurements by the voltage sensor 586 be averaged. In one possible embodiment, that predetermined quantity is eight of such measurements, so that with each new measurement taken following an instance of audio signal activity, the last eight of those measurements are averaged, and the adaptive threshold voltage is set to a new voltage level based on that average with an offset voltage level added.

At time tc, the last performance of the current injection test following an instance of audio signal activity ending takes place, resulting in the last measurement of a voltage level being taken by the voltage sensor 586 that will be averaged, and resulting in the adaptive threshold voltage being set for the last time. This is because an inactivity wait period starting at time tc elapses without further audio signal activity on the tested conductor, thereby triggering the controller 550 to carry out further performances of the current injection test to obtain voltage measures for purposes of comparison to the adaptive threshold voltage, and not for purposes of recalculating the adaptive threshold voltage.

Were the first of such performances of the current injection test following time tc to result in a voltage level being detected that is less than the threshold voltage, then the controller 550 would determine that the tested conductor is still coupled to an active intercom system, and that the lack of audio signal activity during the inactivity wait time period was due simply to a lack of voice communications occurring. In that case, the controller 550 would wait either for another instance of the inactivity wait time period to elapse and again perform the current injection test for purposes of a comparison of voltage levels, or until new audio signal activity occurs—whichever one occurs first. However, as depicted in FIG. 7b, the result of this first current injection test following time tc is a different outcome in which the voltage level measured by the voltage sensor 586 is above the threshold voltage, thereby leading to a determination by the controller 550 that the tested conductor is no longer coupled to an active intercom system.

As a result of this depicted outcome, the controller 550 waits throughout a standby time period for either a later performance of current injection test for purposes of making a comparison to reveal a voltage level that is once again below the threshold voltage or for an instance of new audio signal activity to occur—either of which would be an indication of the tested conductors once again being coupled to an active intercom system. If either of these occur before the elapsing of the standby time period, then the controller 550 would resume performing current injection tests at times following instances of audio signal activity and again for the purpose of obtaining voltage measurements for recalculating the adaptive threshold voltage, just as was done in the period of time between times tb and tc. However, if the standby time period elapses without any new audio signal activity and without any performance of the current injection test for purposes of comparison resulting in a voltage level below the threshold voltage being found, then at time td, the controller 550 may turn off one or more components of the headset 1000 (perhaps turning off all of the components to turn off the entirety of the headset 1000).

Figure 9A:
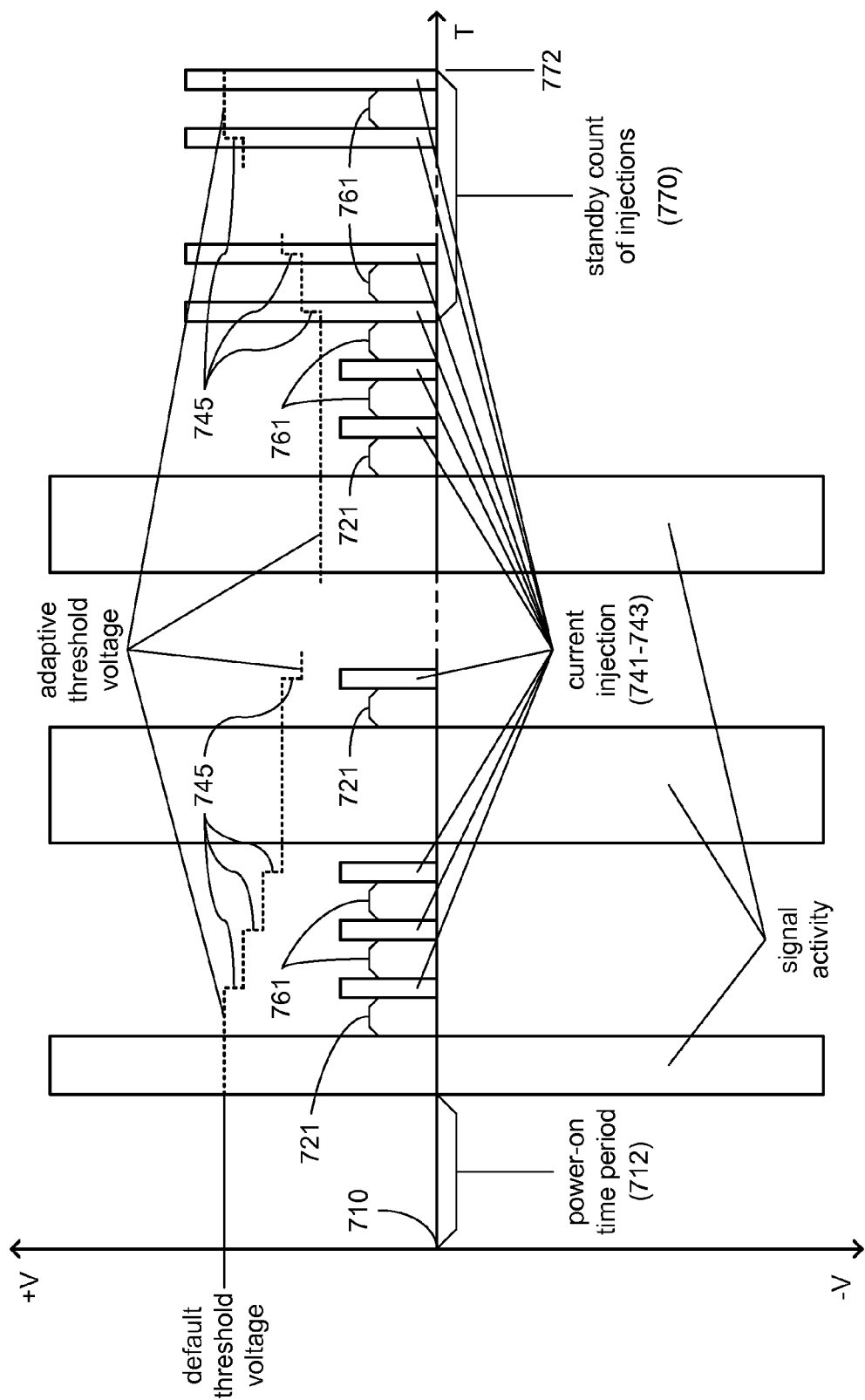
FIGS. 9a and 9b are a graph and a flowchart of another embodiment of multiple performances of testing a conductor by injection of current by the control circuit of either FIG. 3 or FIG. 5, and multiple uses of the results of this embodiment of the test.
Figure 9B:
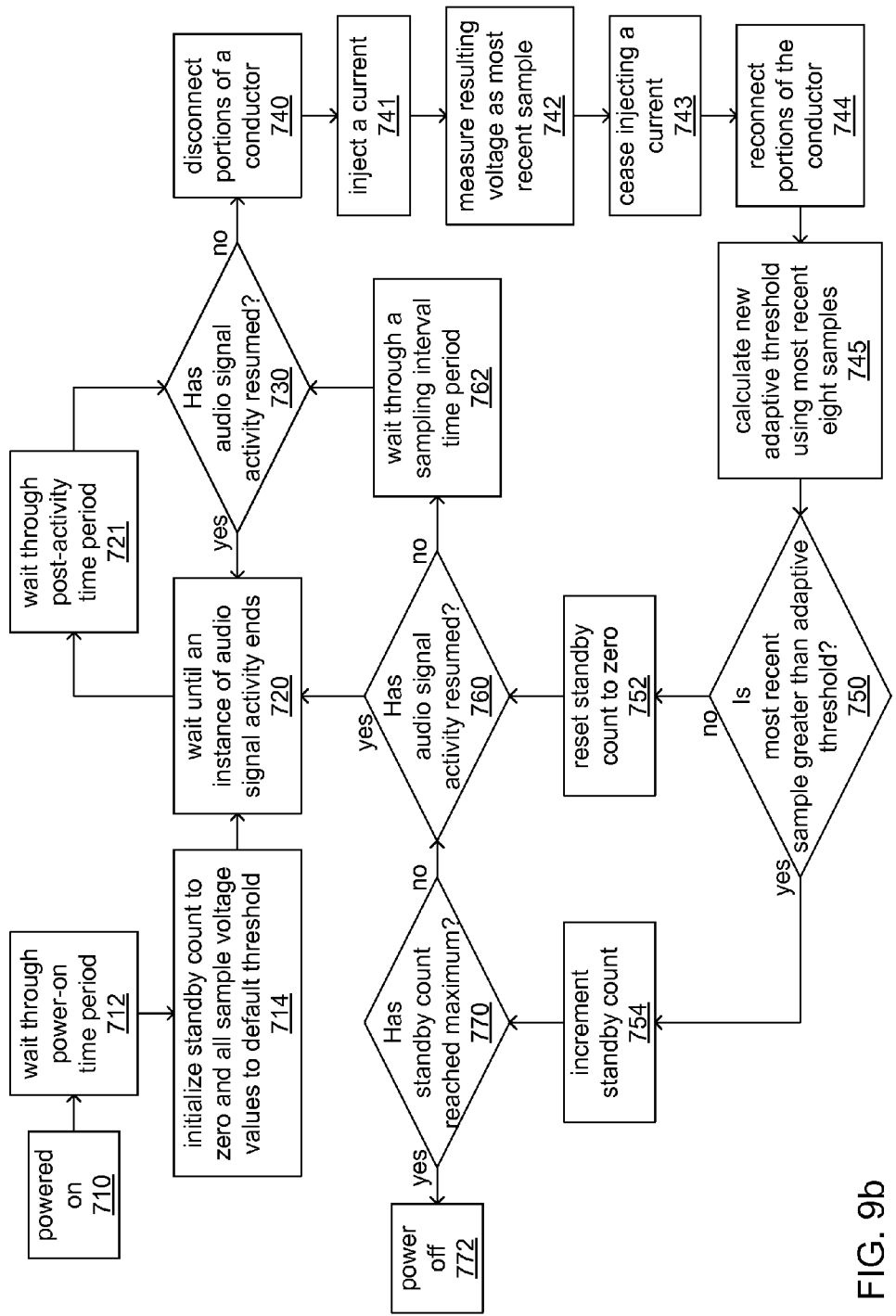

Turning to FIGS. 9a and 9b, details are depicted of another more complex embodiment in which a threshold voltage is again set based on an average of multiple performances of this test. However, this more complex embodiment differs from that of the FIG. 8 inasmuch as there is no distinction between performing current injection tests to obtain measurements of the resulting voltage to be averaged to calculate the adaptive threshold voltage and performing current injection tests to obtain measurements of the resulting voltage to compare to the adaptive threshold voltage. In short, in this embodiment, current injection tests are performed throughout periods of time between instances of activity on whichever conductor is tested, and the measurements taken during every current injection test are used both in the rolling average calculation to repeatedly calculate the threshold voltage and in comparisons to the adaptive threshold voltage. To aid in the clarity of this discussion, it should be noted that FIGS. 9a and 9b are meant to be viewed together, and so some of the reference numerals of the flowchart of FIG. 9b are also provided in FIG. 9a to make correlations easier to understand.

At 710, the headset 1000 is powered on, thereby beginning a power-on time period that the controller 550 waits through at 712. As was the case in the embodiment of FIG. 8, no current injection tests are performed during the power-on time period in the embodiment of FIGS. 9a-b, and again, this is to allow the user of the headset 1000 to "settle down" in preparation to performing whatever task that will require use of the headset 1000. At 714, the controller 550 initializes all of the storage locations within whatever storage device will be employed in storing the most recent eight measured voltage levels to a default threshold voltage level. Also at 714, the controller 550 initializes a standby count to zero. As before, this default threshold voltage level is selected based on measurements of resistances found to exist in a sampling of intercom systems in use by potential users, with the intent of beginning the operation of the headset 1000 with the adaptive threshold voltage already set to a level that is believed to be likely to function correctly with the majority of intercom systems to which the headset 1000 is likely to be coupled At 720, the controller 550 operates the audio signal presence detector 580 to monitor the tested conductor for audio signal activity and waits for any current instance of signal activity to end. Following the end of an instance of signal activity, the controller 550 waits through a post-activity waiting time period at 721 before again checking at 730 with the audio signal presence detector 586 to make sure that signal activity has not resumed on the tested conductor. Waiting both for the end of an instance of signal activity and through an additional delay before attempting to perform a current injection test may be deemed desirable to try to avoid instances of interrupting a spoken word that occurs after a brief pause between words. In short, this may be deemed desirable to avoid having conversations interrupted due to a brief pause between words being used as opportunities to perform current injection tests in a manner that interrupts voice communications. If signal activity is found to have resumed at 730, then the end to this new instance of signal activity is awaited, once again, at 720. However, if no such resumption of activity has been found to occur at 730, then a current injection test begins at 740.

At 740, the controller 550 operates the audio signal interrupter 582 to disconnect the portion of the tested one of the audio-left and audio-right conductors coupled to one of the acoustic drivers 115 from the other portion that may be coupled to an intercom system. At 741, the controller 550 operates the excitation current injector 584 to inject a current onto the tested conductor. At 742, the controller 550 operates the voltage sensor 586 to measure the voltage on the tested conductor (relative to the system-gnd conductor) that results from the injection of current. At 743, the controller 550 operates the excitation current injector 584 to cease injecting a current into the tested conductor. At 744, the controller 550 operates the audio signal interrupter 582 to reconnect the two previously disconnected portions of the tested conductor.

Following this instance of performing the current injection test at 740-744, the controller 550 then uses the voltage measurement just taken using the voltage sensor 586 to calculate a new threshold voltage at 745. As was the case in the embodiment of FIG. 8, a "rolling average" in which some quantity of most recent voltage measurements are averaged together is first calculated, followed by an offset voltage level equivalent (through Ohm's law) to a 20 ohm offset resistance. In this embodiment, again as an example, the quantity is eight. Where it is still relatively soon after the end of the power-on time period such that less than eight voltage measurements have been taken, thus far, the default threshold voltage with which the storage locations for holding the eight most recent voltage measurement were earlier initialized are used until enough voltage measurements have been taken to fill all of those storage locations.

At 750, the controller 550 compares the most recently measured voltage level to the newly calculated adaptive threshold voltage. If the most recently measured voltage level is greater than the newly calculated threshold voltage, then a the standby count is incremented by 1, and a check is made by the controller 550 at 770 to determine whether or not the standby count has reached a predetermined maximum value. If the maximum value of the standby count is reached, then the controller 550 powers off the headset 1000 at 772 (i.e., powers off all, or substantially all, of the components of the headset 1000). The maximum value of the standby count is selected to result in a desired amount of time to elapse following a possible uncoupling of the headset 1000 from an intercom system before the controller 550 takes such action.

However, if the most recently measured voltage level is not greater than the threshold voltage at 750 then the standby count is reset to zero, and the controller 550 operates the audio signal presence detector 580 at 760 to determine whether or not audio signal activity has yet resumed on the tested conductor. If activity has resumed, then the controller 550 again awaits the end of the new instance of audio signal activity at 720. If audio signal activity has not resumed, then the controller waits through an interval period at 762 before checking for signal activity one more time at 730.

Turning to FIG. 9a, during the time where the standby count is being incremented leading up to where the controller 550 powers off the headset 1000 at 772, each new performance of the current injection test results in a voltage measures reflecting the greater voltage associated with the tested conductor no longer being coupled to an active intercom system. Depending on the quantity of current injection tests done during this time, as more of these higher voltage measures are taken and used in recalculating the adaptive threshold, the resulting adaptive threshold would eventually be raised to a level of voltage above the higher voltage measures being taken with each new current injection test performed during this time, with the result that the higher voltage measures would cease to be greater than the adaptive threshold voltage. As a result, the headset 1000 might never be caused to be turned off by the controller 550, because the conditions required to trigger that event might never occur. To prevent this, in some embodiments, a maximum threshold voltage value may be imposed on the adaptive threshold voltage such that a succession of current injection tests resulting in high voltage measures associated with not being coupled to an active intercom system would never be able to raise the adaptive threshold voltage above that maximum threshold voltage value. In some of these embodiments, this maximum threshold voltage value may be selected to be the same as the value of the default threshold voltage.

It should be noted that although FIGS. 6a-c, 7, 8 and 9a-b depict various details and challenges of testing either of the audio-left or audio-right conductors, this should not be taken as an indication that the use of such approaches to performing current injection tests cannot be applied to any of the other conductors that may be used to couple the headset 1000 to an intercom system. As with the audio-left and audio-right conductors, others of the conductors coupling the headset 1000 can be expected to have different levels of resistance between them and a ground conductor (e.g., the system-gnd conductor, depending on whether they are coupled to an active intercom system, to an inactive intercom system, or to no intercom system, at all.

Figure 10:
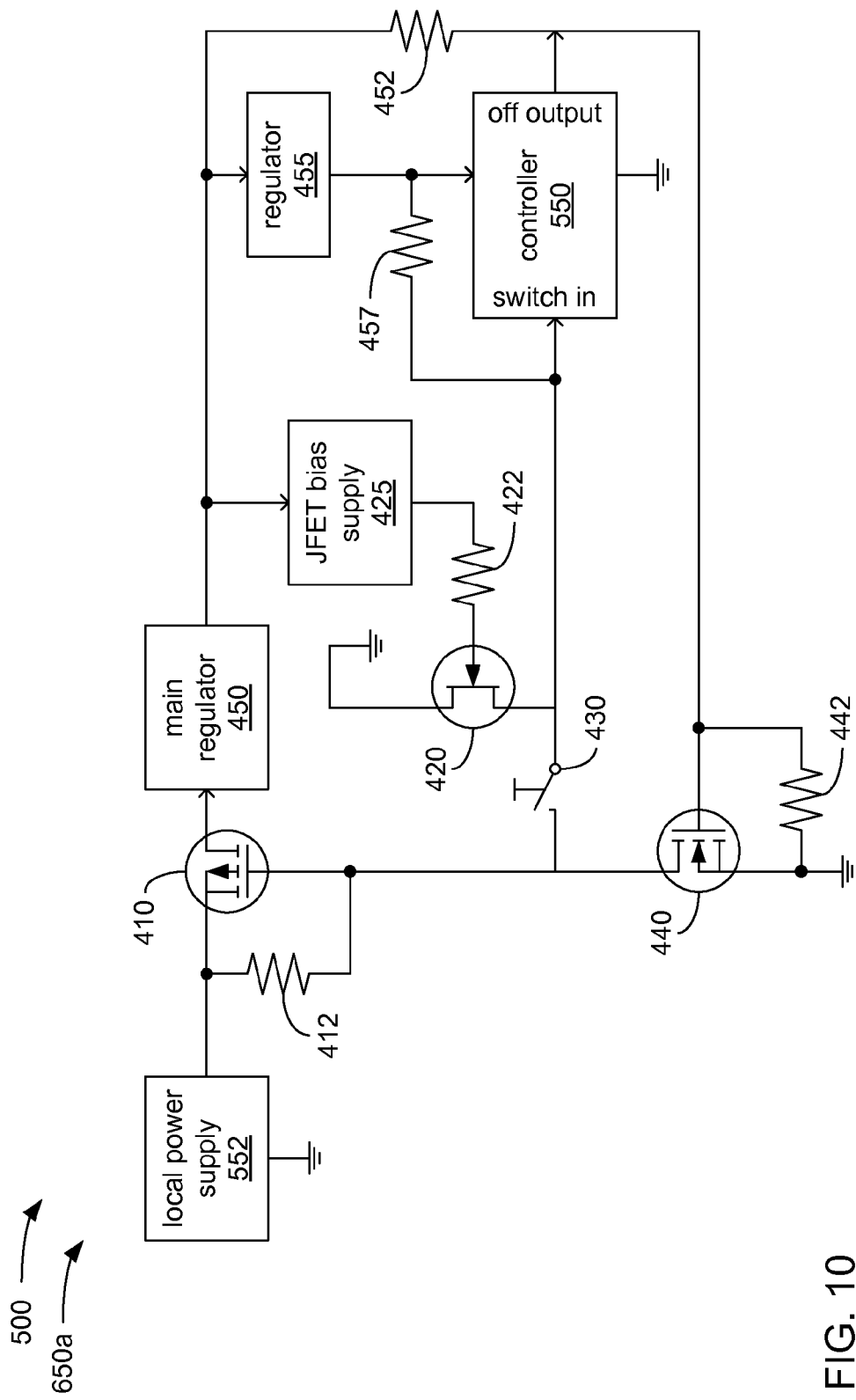
FIGS. 10, 11 and 12 are each block diagrams of an electrical architecture portions that may be added to the electrical architecture of either of FIG. 3 or FIG. 5 to add a pushbutton power on switch and supporting components that do not draw power while the headset of FIG. 1 is in an off state.

FIG. 10 depicts a portion 650a of an electrical architecture that may be added to either of the electrical architectures 600a or 600b (or to the electrical architectures of other possible embodiments of the headset 1000 or of portions of the headset 1000) to provide a user of the headset 1000 with a form of pushbutton power switch supported with other components selected and interconnected in a manner that consumes no power from the local power supply 552 until it is used to turn the headset 1000 on. This may be deemed desirable where the local power supply 552 is a power source of limited capacity (e.g., a battery) such that it is seen as undesired to provide a pushbutton power switch that is monitored by the controller 550 in a manner in which the controller 550 must continuously draw power from the local power supply 552, even at times when the headset 1000 appears to be "off" from the perspective of a user.

In the electrical architecture portion 650a, the control circuit 500 further incorporates MOSFETs 410 and 440; resistors 412, 422, 442, 452 and 457; a JFET 420; a JFET bias supply 425; a pushbutton switch 430; and voltage regulators 450 and 455. A high voltage potential terminal of the local power supply 552 is coupled to the resistor 412 and the input of the main voltage regulator 450 through the MOSFET 410 (i.e., is coupled to the source of the MOSFET 410, with the drain of the MOSFET coupled to the input of the main voltage regulator 450). A low voltage potential terminal of the local power supply 552 is coupled to the system-gnd conductor (a.k.a., "ground"). The resistor 412 is coupled to the gate of the MOSFET 410 (as well as to the source), the switch 430 and the drain of the MOSFET 440. The output of the main voltage regulator 450 is coupled to the input of the JFET bias supply 425, the input of the regulator 455 and the resistor 452. The output of the JFET bias supply is coupled to the gate of the JFET 420 through the resistor 422. The output of the regulator 455 is coupled to the controller 550 and both the JFET 420 and the switch 430 through the resistor 457, as well as being coupled to a switch input of the controller 550 through the resistor 457. The resistor 452 is coupled to an off output of the controller 550, to the gate of the MOSFET 440 and to ground (i.e., the system-gnd conductor to which the low voltage potential terminal of the local power source is also coupled) through the resistor 442. The JFET 420 and the source of the MOSFET 440 are also both coupled to ground.

At a time when the headset 1000 is powered off, the gate of the MOSFET 410 is provided with the same high voltage potential of the local power supply 552 as its source through the resistor 412 such that the MOSFET 410 is in a non-conductive state and does not allow current to pass through it. The gate of the MOSFET 440 is provided with the low voltage potential through the resistor 442 such that the MOSFET 440 is also in a non-conductive state and also does not allow current to pass through it. In contrast, the gate of the JFET 420 is provided with a low voltage potential through the resistor 422 from the JFET bias supply 425 such that the JFET enters a conductive state in which it allows current to pass between its source and drain. The JFET bias power supply 425 provides no bias to the gate of the JFET 420 resulting in the JFET 420 being in a conductive state that couples the switch 430 to ground.

Thus, when the headset 1000 is powered off, no power reaches the main regulator 450 from the local power supply 552, and therefore, the JFET bias supply 425, the regulator 455 and the controller 550 are not provided with power. The MOSFET 410 is selected to be the device that gates the flow of electric power from the local power supply 552 to these components due to its ability to provide an extremely high resistance between its source and drain. The MOSFET 410 is also selected due to its lack of current flow through its gate such that high voltage potential of the output of the local power supply 552 is able to be provided through the resistor 412 to the gate of the MOSFET 410 without the MOSFET 410 providing a path for current flow through its gate that would eventually drain the local power supply 552.

It is important to note that, technically speaking, there is still a leakage current that flows through the MOSFETs 410 and 440 while in their non-conductive states. However, as those skilled in the art will already recognize, variants of MOSFETs are available in which this leakage current is so very small, that the leakage between the poles within a battery, the leakage between two contacts of a mechanical switch separated by open air and the leakage between two adjacent traces on typical circuitboards can each be greater than the leakage through some types of MOSFETs that may be employed as the MOSFETs 410 and 440. Therefore, in stating that the circuits depicted in each of the electrical architecture portion 650a does not draw power from the local power supply 552, it is being stated that effectively, the current flow from the local power supply through either of the MOSFETs 410 and 440 is so very negligible that it can be ignored to the extent of being able to say that there is no current flow. In effect, where the local power supply 552 is a battery, the local power supply 552 will literally drain itself of power through the inherent self-leakage of typical batteries long before any other portion of the electrical architecture portion 650a will do so.

Therefore, as long as the high voltage potential of the local power supply 552 continues to be provided to the gate of the MOSFET 410, no current flows from the local power supply 552 to the other components depicted in FIG. 10. Yet, the JFET 420 is in a conductive state in which it serves to couple the normally-open pushbutton switch 430 to ground. When a user operates the pushbutton switch 430 to close it, the gate of the MOSFET 410 is then coupled through the pushbutton switch 430 and the JFET 420 to ground, thereby removing the high voltage potential previously provided to the gate of the MOSFET 410. With this change to the low potential of the ground being applied to the gate of the MOSFET 410, the MOSFET 410 responds by allowing current to flow through between its source and drain such that the main regulator 450 is then provided with electric power from the local power supply. In turn, the main regulator provides electric power (at one regulated voltage) to the gate of the MOSFET 440 through the resistor 452. The MOSFET 440 responds to the provision of the high voltage potential of the output of the main regulator 450 through the resistor 452 to its gate by switching to being in a conductive state such that it couples the gate of the MOSFET 410 through its own source and drain. This interaction between the MOSFETs 410 and 440 serves to latch both MOSFETs in their conductive state such that the MOSFET 410 continues to allow current to flow from the local power supply 552 to the main regulator 450 and the MOSFET 440 continues to couple the gate of the MOSFET 410 to ground.

The main regulator 450 also provides power to the regulator 455, which in turn, provides electric power to the controller 550 (at another regulated voltage) and provides a positive voltage potential to the conductor coupling the pushbutton switch 430 to an input of the controller 550. Further, an output of the controller 550 is coupled to the conductor coupling the resistor 452 to the gate of the MOSFET 440. It is through this conductor coupling the output of the controller 550 to the gate of the MOSFET 440 that the controller 550 is able to autonomously turn off the headset 1000 by pulling this conductor down to a low voltage potential, such that the MOSFET 440 ceases to couple the gate of the MOSFET 410 to ground, thereby undoing the latching interaction between the MOSFETs 410 and 440.

The main regulator 450 further provides electric power to the JFET bias supply 425, which in turn, provides a negative voltage potential to the gate of the JFET 420 through the resistor 422. The JFET 420 responds to the change from a low voltage potential to a negative voltage potential at its gate by switching to a non-conductive state such that it no longer couples the pushbutton switch 430 through its source and drain to ground (i.e., the system-gnd conductor). With one side of the pushbutton switch 430 now being coupled to ground through the MOSFET 440, and with the other side of the pushbutton switch 430 being coupled to the switch input of the controller 550 and the pull-up resistor 457, the normally-open pushbutton switch 430 is now able to serve as an input control to the controller 550 that is operable by a user of the headset 1000 to control various aspects of the operation of the headset 1000. The pull-up resistor 457 pulls the voltage potential at the switch input of the controller 550 to a high voltage, and closing the switch 430 couples the switch input of the controller 550 through the switch 430 and the MOSFET 440 (now in a conductive state) to ground (i.e., the low potential of the system-gnd conductor).

The controller 550 may be or may incorporate a processing device that executes a routine made up of a sequence of instructions stored within a storage of the controller 550 that causes the processing device to monitor the switch input of the controller 550 for instances of the switch input being pulled down to a low voltage potential, thereby effectively monitoring the state of the switch 430. Execution of the routine by the processing device may put in place various responses to particular sequences of operation of the switch by a user of the headset 1000, thereby possibly allowing the user of the headset 1000 to control various features of its functionality through differing combinations of relatively rapid sequences of button presses and/or button presses of particular durations. By way of example, a quick pressing of the switch 430 two times in rapid succession (what might be called a quick "double-press") may adjust a volume with which audio is acoustically output by the acoustic drivers 115. By way of another example, a single button press lasting a minimum of a predetermined number of seconds (what might be called a "press-and-hold") may signal the controller (i.e., the processing device of the controller) to turn off the headset 1000. Thus, in this way, the switch 430 may also be used as an "off switch" by the user.

This dual use of the switch 430 as both the "on" button and the "off" button is thereby accomplished with the "on" function of the switch 430 being accomplished through the latching interaction of the MOSFETs 410 and 440 without any participation by the controller 550, while the "off" function of the switch 430 does require action by the controller 550 to accomplish. This can provide the headset 1000 with a useful "failsafe" feature in which the headset 1000 can be turned "on" such that at least basic functions are fully powered, even if the controller 550 is in some way malfunctioning. For operators of vehicles or large machinery where being able to use the headset 1000 to communicate with others without interruption is extremely important (e.g., a pilot in an airplane, an operator of a submersible vehicle, etc.).

As those skilled in the art of the operation of processing devices executing sequences of routines are well aware, even where a routine does not contain an error that causes a processing device to act unpredictably, memory errors, static discharge events, overheating of components, etc., can cause a processing device to cease to execute a sequence of instructions correctly, such that it becomes unresponsive. In more convention pushbutton on switch controls, where a processing device is relied upon to repeatedly monitor a switch for an instance of it being operated to turn on a device, an event causing the processing device to cease to execute instructions correctly can easily result in the a user's user of that switch to turn on that device being entirely ignored. In contrast, the decided lack of reliance on the controller 550 to in any way participate in responding to a user's operation of the switch 430 to turn on the headset 1000 means that the headset 1000 can be turned on by a user and used even where the controller 550 is utterly unresponsive, thereby helping to ensure that the user will be able to use the headset 1000 to continue to engage in necessary communications, even with such a malfunction in progress.

Figure 11:
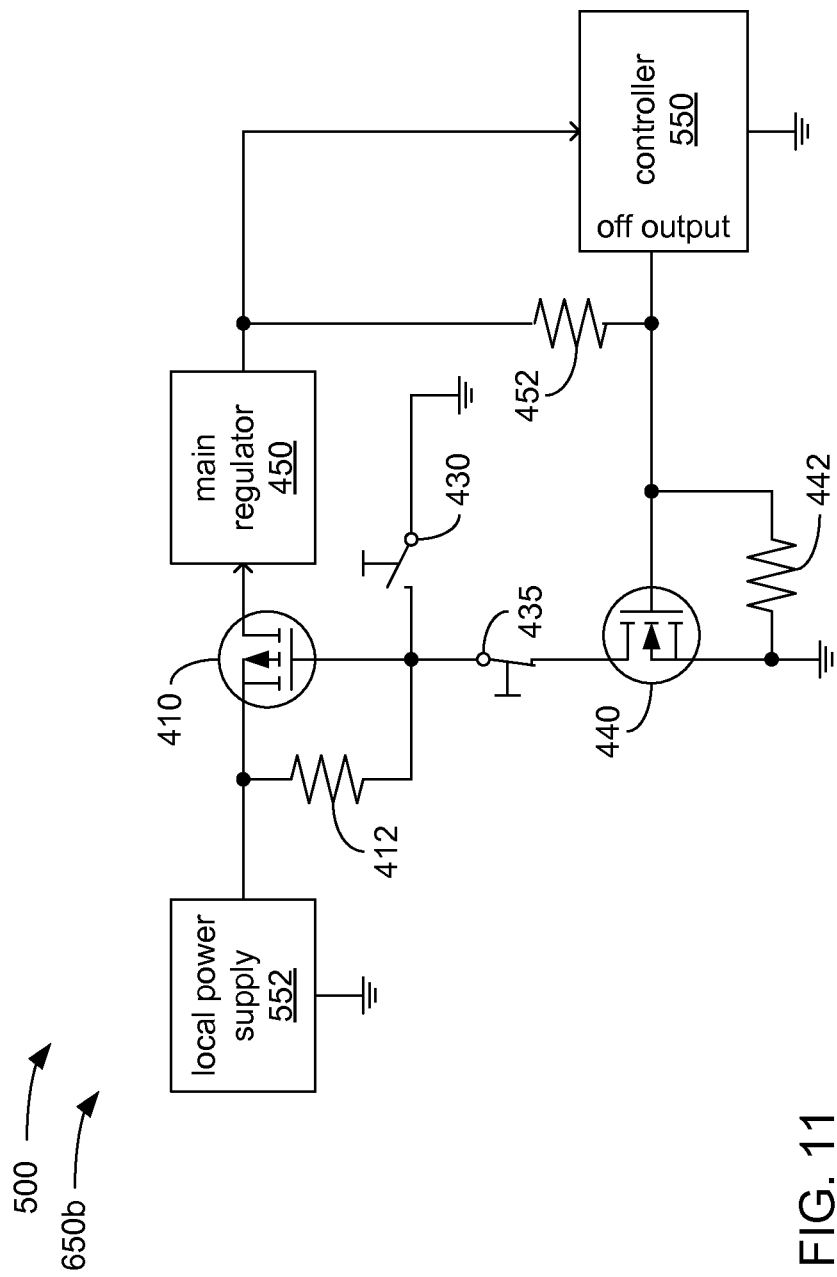

FIG. 11 depicts an alternate portion 650b of an electrical architecture that may be added to either of the electrical architectures 600a or 600b (or to the electrical architectures of other possible embodiments of the headset 1000 or of portions of the headset 1000) to provide a user of the headset 1000 with a form of dual pushbutton power switch supported with other components selected and interconnected in a manner that consumes no power from the local power supply 552 until it is used to turn the headset 1000 on. The electrical architecture portion 650b differs from the electrical architecture portion 650a in that numerous components of the electrical architecture portion 650a have been removed, and a normally closed switch 435 has been added.

Again, the local power supply 552 is coupled to the resistor 412 and the input of the main voltage regulator 450 through the MOSFET 410. The resistor 412 is coupled to the gate of the MOSFET 410, the switch 430 and the MOSFET 440 through the switch 435. The output of the main voltage regulator 450 is coupled to the controller 550 and the resistor 452. The resistor 452 is coupled to an off output of the controller 550, to the gate of the MOSFET 440 and to ground (i.e., the system-gnd conductor) through the resistor 442. The MOSFET 440 is also both coupled to ground.

At a time when the headset 1000 is powered off, the gate of the MOSFET 410 is provided with the same high voltage potential of the local power supply 552 as its source through the resistor 412 such that the MOSFET 410 is in a non-conductive state and does not allow current to pass through it. The gate of the MOSFET 440 is provided with the low voltage potential through the resistor 442 such that the MOSFET 440 is also in a non-conductive state and also does not allow current to pass through it. Therefore, as long as the high voltage potential of the local power supply 552 continues to be provided to the gate of the MOSFET 410, no current flows from the local power supply 552 to the other components depicted in FIG. 11.

When a user operates the pushbutton switch 430 to close it, the gate of the MOSFET 410 is then coupled through the pushbutton switch 430 and the JFET 420 to ground (i.e., the system-gnd conductor), thereby removing the high voltage potential previously provided to the gate of the MOSFET 410.

With this change to the low potential of the ground being applied to the gate of the MOSFET 410, the MOSFET 410 responds by allowing current to flow through between its source and drain such that the main regulator 450 is then provided with electric power from the local power supply. In turn, the main regulator provides electric power (at one regulated voltage) to the gate of the MOSFET 440 through the resistor 452. The MOSFET 440 responds to the provision of the high voltage potential of the output of the main regulator 450 through the resistor 452 to its gate by switching to being in a conductive state such that it couples the gate of the MOSFET 410 through its own source and drain. This interaction between the MOSFETs 410 and 440 serves to latch both MOSFETs in their conductive state such that the MOSFET 410 continues to allow current to flow from the local power supply 552 to the main regulator 450 and the MOSFET 440 continues to couple the gate of the MOSFET 410 to ground.

The main regulator 450 also provides power to the controller 550. Further, an output of the controller 550 is coupled to the conductor coupling the resistor 452 to the gate of the MOSFET 440. It is through this conductor coupling the output of the controller 550 to the gate of the MOSFET 440 that the controller 550 is able to autonomously turn off the headset 1000 by pulling this conductor down to a low voltage potential, such that the MOSFET 440 ceases to couple the gate of the MOSFET 410 to ground, thereby undoing the latching interaction between the MOSFETs 410 and 440. The normally-closed switch 435 provides a mechanism by which a user is able to turn off the headset 1000 by directly breaking the coupling of the gate of the MOSFET 410 to ground through the MOSFET 440 when the switch 435 is operated from its normally-closed state to an open state. This undoes the latching interaction between the MOSFETs 410 and 440, causing the MOSFET 410 to return to a non-conductive state, thereby depriving the MOSFET 440 of the high voltage potential presented to its gate through the regulator 450 and the resistor 452. The provision of both of the switches 430 and 435 to enable the headset 1000 to be both turned on and turned off without involvement of the controller 550 may be deemed desirable where the ability to turn the headset 1000 off despite a malfunction of the controller 550 is wanted.

Figure 12:
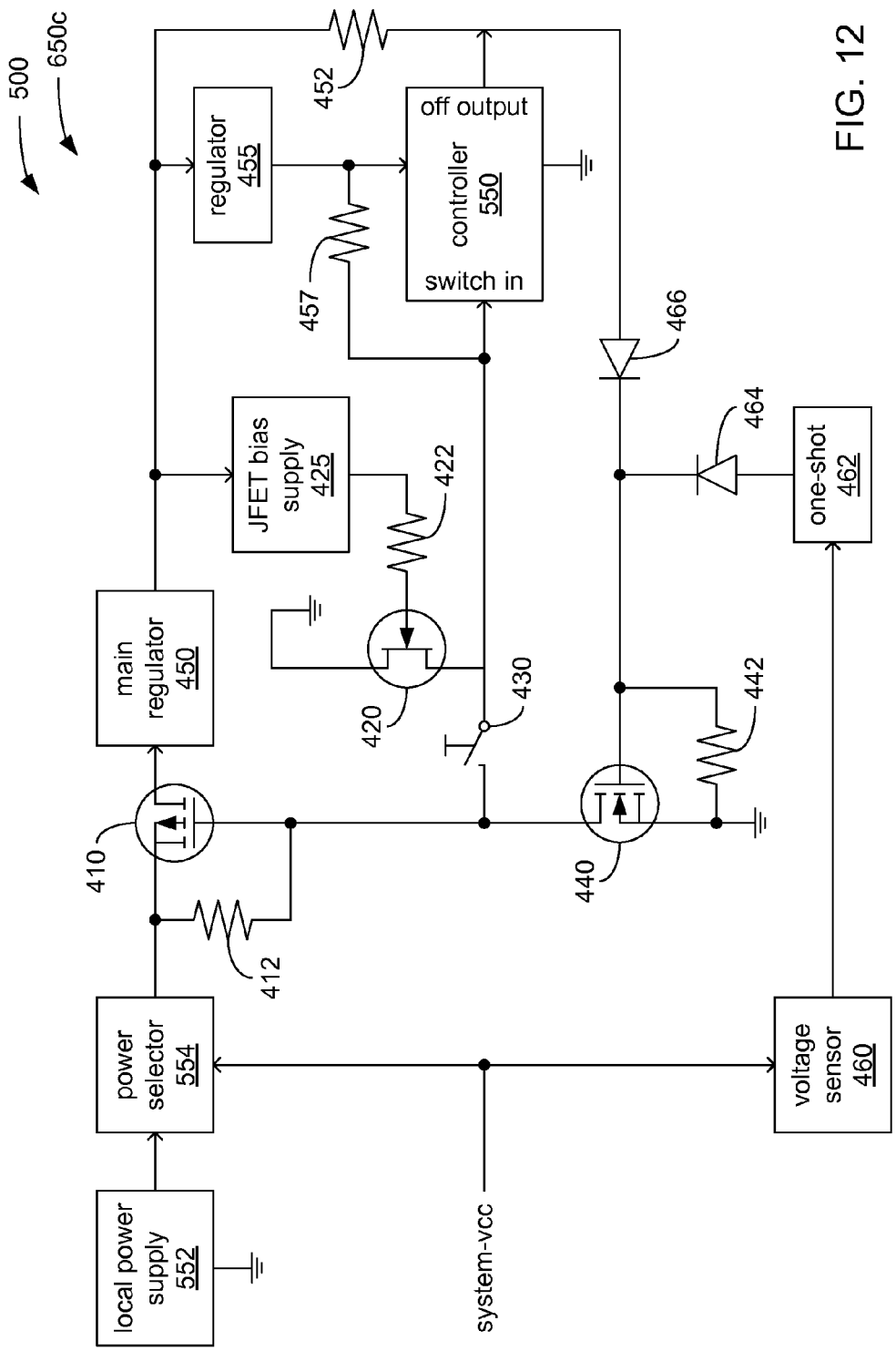

FIG. 12 depicts a portion 650c of yet another electrical architecture that may be added to either of the electrical architectures 600a or 600b (or to the electrical architectures of other possible embodiments of the headset 1000 or of portions of the headset 1000) to provide a user of the headset 1000 with a form of pushbutton power switch supported with other components selected and interconnected in a manner that consumes no power from the local power supply 552 until it is used to turn the headset 1000 on. The electrical architecture portion 650c is substantially similar to the electrical architecture portion 650a, with the exception that the electrical architecture portion 650c adds the facility to cause the headset 1000 to be automatically turned on when coupled to an intercom system that provides electric power via the system-vcc conductor, in addition to providing the ability to automatically switch between drawing power from the local power supply 552 when power via the system-vcc conductor is not provided and drawing power from the system-vcc conductor when such power is provided.

In the electrical architecture portion 650c, the power selector 554 is interposed between the local power supply 552 and both the MOSFET 410 and the resistor 412 to enable the power selector 554 to automatically select between power provided by the local power supply 552 and power provided via the system-vcc conductor. In some embodiments, the power selector 554 is a power multiplexer that automatically selects whichever power source provides power with a greater voltage, and the local power supply is selected and/or configured to always provide power with a lesser voltage than the electric power expected to be received from an intercom system via the system-vcc conductor. In this way, the power selector 554 is caused to always select the electric power provided by the system-vcc conductor when that electric power is available so as to attempt to conserve the electric power provided by the local power supply 552.

The system-vcc conductor is also coupled to a voltage sensor 460 that is further coupled to a one-shot 462 (also commonly referred to as "monostable multivibrator" or "mono-shot"). The voltage sensor 460 monitors the system-vcc conductor for transitions in the state of the system-vcc from a low voltage potential (relative to the system-gnd conductor) associated with no power being provided by an intercom system to a high voltage potential associated with such power being provided. Where such transitions occur, the voltage sensor 460 electrically signals the one-shot 462 to inject a pulse of a high voltage potential through a diode 464 to the gate of the MOSFET 440. The length of the high potential pulse output by the one-shot 462 is selected to ensure that the MOSFET 440 is put into a conductive state with a high voltage potential at its gate for a long enough time to cause the MOSFET 410 to enter into a conductive state that enables electric power to be provided to the main regulator 450 (now from the system-vcc conductor), which in turn, causes a high voltage potential to be provided to the gate of the MOSFET 440 through the resistor 452 and through another diode 466. This has the effect of causing the MOSFETs 410 and 440 to engage in a latching interaction. The diodes 464 and 466 serve to protect the main regulator 450 and the one-shot 462 from damaging one another.

It should be noted that although much of the discussion of the power control features, including actions taken by the controller 550 in response to changing circumstances to turn on or off components, and including the latching interaction and zero power drain of the MOSFETs 410 and 440 in conjunction with the switch 430, has centered on the headset 1000, and even more particularly to the user of the headset 1000 with an intercom of an airplane, it should be noted that these power control features may also be employed in other personal audio devices. Such other personal audio devices include, but are not limited to, headphones (including in-ear, over-the-ear, and around-the-ear variants), walkie talkies, corded microphones for two-way radios, wireless headsets, pairs of headphones (with or without ANR capability), etc. These features are believed to be of use in any form of personal audio device in which there is need to conserve electric power provided by a power source of limited capacity.

Other embodiments and implementations are within the scope of the following claims and other claims to which the applicant may be entitled.

The invention claimed is:

1. An apparatus comprising:
   a normally-open manually operable switch;
   a first MOSFET having a first gate coupled to the switch, and a first source coupled to a high voltage potential terminal of a power source to receive electric power therefrom;
   a second MOSFET having a second source coupled to a low voltage potential terminal of the power source; a second drain coupled to the switch and to the first gate of the first MOSFET, and a second gate to receive electric power from the power source through at least the first source and a first drain of the first MOSFET;

a third transistor having a third source coupled to the low potential terminal of the power source, a third drain coupled to the switch, and a third gate to receive a bias voltage through at least the first source and drain of the first MOSFET; and wherein closing the switch couples the first gate to the low potential voltage terminal of the power source through the third transistor while the third transistor is in a conductive state, placing the first MOSFET into a conductive state, providing a high voltage potential through the first MOSFET to the second gate, placing the second MOSFET into a conductive state, providing a low voltage potential to the first gate to latch the first and the second MOSFETs in a conductive state, and placing the first MOSFET into the conductive state also provides the bias voltage through the first MOSFET to the third gate, placing the third transistor into a non-conductive state, decoupling the switch from the low potential voltage terminal of the power source while the first MOSFET is in the conductive state.

2. A method comprising:

waiting for a provision of electric power from a power source caused by a latching interaction of a first MOSFET and a second MOSFET triggered by a normally open switch;

disrupting the latching interaction of the first and second MOSFETs in response to the switch being closed; and using a third transistor to decouple the switch from a low voltage terminal of the power source when the first MOSFET is in a conductive state.

3. The apparatus of claim 1, further comprising:

a pull-up resistor providing power from the first drain to a switch input of a controller; the pull-up resistor and the switch input of the controller coupled to the manually-operable switch, wherein closing the switch while the second MOSFET is in the conductive state couples the switch input of the controller to the low potential voltage terminal of the power source through the source and drain of the second MOSFET.

* * * * *